US012532728B2

(12) United States Patent
Chuang et al.

(10) Patent No.: US 12,532,728 B2
(45) Date of Patent: Jan. 20, 2026

(54) BACKSIDE LEAKAGE PREVENTION

(71) Applicant: Taiwan Semiconductor Manufacturing Company, Ltd., Hsinchu (TW)

(72) Inventors: Harry-Haklay Chuang, Hsinchu (TW); Wen-Tuo Huang, Tainan (TW); Wei-Cheng Wu, Hsinchu County (TW); Ching I Li, Hsinchu (TW)

(73) Assignee: AIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 716 days.

(21) Appl. No.: 17/824,391

(22) Filed: May 25, 2022

(65) Prior Publication Data

US 2023/0307322 A1 Sep. 28, 2023

Related U.S. Application Data

(60) Provisional application No. 63/323,383, filed on Mar. 24, 2022.

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76898* (2013.01); *H01L 23/564* (2013.01);
(Continued)

(58) Field of Classification Search
CPC ............ H01L 23/481; H01L 21/76898; H01L 23/564; H01L 24/32; H01L 25/0657;
(Continued)

(56) References Cited

U.S. PATENT DOCUMENTS

2019/0123074 A1* 4/2019 Chen ................ H10F 39/024
2020/0006128 A1* 1/2020 Weng ............... H01L 21/76807
(Continued)

FOREIGN PATENT DOCUMENTS

CN 106941120 A 7/2017
CN 108321198 A 7/2018
(Continued)

*Primary Examiner* — Yara B Green
*Assistant Examiner* — Akhee Sarker-Nag
(74) *Attorney, Agent, or Firm* — HAYNES AND BOONE, LLP

(57) ABSTRACT

A package structure according to the present disclosure includes a bottom substrate, a bottom interconnect structure over the bottom substrate, a top interconnect structure disposed over the bottom interconnect structure and including a metal feature, a top substrate over the top interconnect structure, and a protective film disposed on the top substrate. The protective film includes an interfacial layer on the top substrate, at least one dipole-inducing layer on the interfacial layer, a moisture block layer on the at least one dipole-inducing layer, and a silicon oxide layer over the moisture block layer. The at least one dipole-inducing layer includes aluminum oxide, titanium oxide or zirconium oxide.

20 Claims, 20 Drawing Sheets

(51) Int. Cl.
  *H01L 23/00* (2006.01)
  *H01L 25/065* (2023.01)
(52) U.S. Cl.
  CPC .......... *H01L 24/32* (2013.01); *H01L 25/0657* (2013.01); *H01L 2224/32145* (2013.01); *H01L 2225/06541* (2013.01)
(58) Field of Classification Search
  CPC . H01L 2224/32145; H01L 2225/06541; H01L 23/53295; H01L 24/80; H01L 2224/08145; H01L 2224/80011; H01L 2224/80013; H01L 2224/80357; H01L 2224/80895; H01L 2224/80896; H01L 24/25; H01L 25/50
  See application file for complete search history.

(56) References Cited

U.S. PATENT DOCUMENTS

| | | | |
|---|---|---|---|
| 2020/0006343 A1 | 1/2020 | Ok | |
| 2020/0082885 A1* | 3/2020 | Lin | G11C 14/0081 |
| 2024/0038631 A1* | 2/2024 | Hu | H01L 23/473 |
| 2024/0122028 A1* | 4/2024 | Ikeda | G02B 27/02 |

FOREIGN PATENT DOCUMENTS

| | | |
|---|---|---|
| TW | 201523851 A | 6/2015 |
| TW | 202207320 A | 2/2022 |

* cited by examiner

BACKSIDE LEAKAGE PREVENTION

PRIORITY DATA

The present application claims the benefit of U.S. Provisional Application No. 63/323,383, filed May 24, 2022, herein incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Multi-dimensional integrated chips are generally formed by stacking multiple semiconductor substrates (e.g., semiconductor wafers) onto one another. For example, during a multi-dimensional integrated chip fabrication process, a top wafer may be flipped over and bonded to a bottom wafer. After the bonding process is finished, a semiconductor substrate of the top wafer may be thinned to a reduced final thickness suitable for the desired application. Generally, the final thickness for high voltage applications is greater than the final thickness for logic or low voltage application. The reduced thickness also makes it easier to form through-substrate-vias (TSVs, or through-silicon-vias) from the back side of the top wafer. The thinning process and the reduced thickness may lead to increase of leakage paths. While existing multi-dimensional integrated chips are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
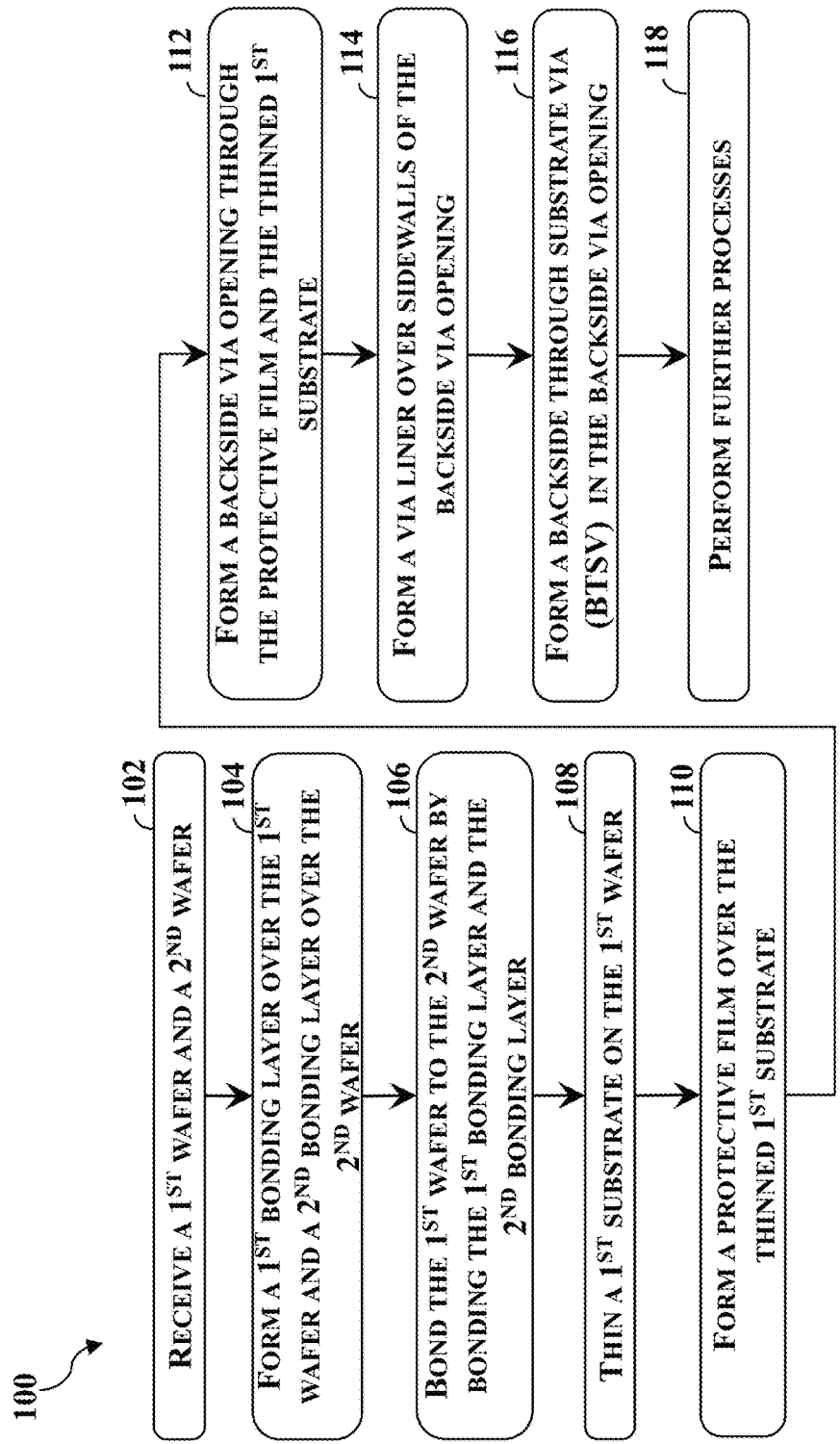
FIG. 1 is a flow chart illustrating an embodiment of a method of forming a package structure including a first wafer and a second wafer, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Multi-dimensional integrated chips are generally formed by stacking multiple semiconductor substrates (e.g., semiconductor wafers) onto one another. For example, during a multi-dimensional integrated chip fabrication process, a top wafer may be flipped over and bonded to a bottom wafer to achieve wafer-to-wafer communication. After the bonding process is finished, a semiconductor substrate of the top wafer may be thinned to a reduced final thickness suitable for the desired application. Generally, the final thickness for high voltage applications is greater than the final thickness for logic or low voltage application. The reduced thickness also makes it easier to form through-substrate-vias (TSVs, or through-silicon-vias) from the back side of the top wafer. The thinning process may introduce dangling bonds on the substrate surface. The dangling bonds and the reduced thickness may lead to increase of leakage paths.

The present disclosure provides a leakage prevention structure that includes one or more layers that are formed of aluminum oxide, titanium oxide, or zirconium oxide. The leakage prevention structure may provide a stronger built-in negative fixed charge to improve leakage protection. Additionally, the leakage prevention structure of the present disclosure may have a smaller thickness to satisfactory leakage protection. The small thickness of the leakage prevention structure may reduce cycle time and production cost.

The various aspects of the present disclosure will now be described in more detail with reference to the figures. In that regard, FIG. 1 is a flowchart illustrating a method 100 of forming a package structure that includes a first wafer and a second wafer, according to various aspects of the present disclosure. Method 100 is merely an example and is not intended to limit the present disclosure to what is explicitly illustrated in method 100. Additional steps can be provided before, during and after method 100, and some steps described can be replaced, eliminated, or moved around for additional embodiments of the method. Not all steps are described herein in detail for reasons of simplicity. Method 100 is described below in conjunction with FIG. 2-14, which are fragmentary cross-sectional views of a first wafer, a second wafer or a wafer stack at different stages of fabrication according to various embodiments of method 100. For avoidance of doubts, the X, Y and Z directions in FIGS. 2-14 are used consistently and perpendicular to one another. Throughout the present disclosure, unless expressly otherwise described, like reference numerals denote like features.

Figure 2:
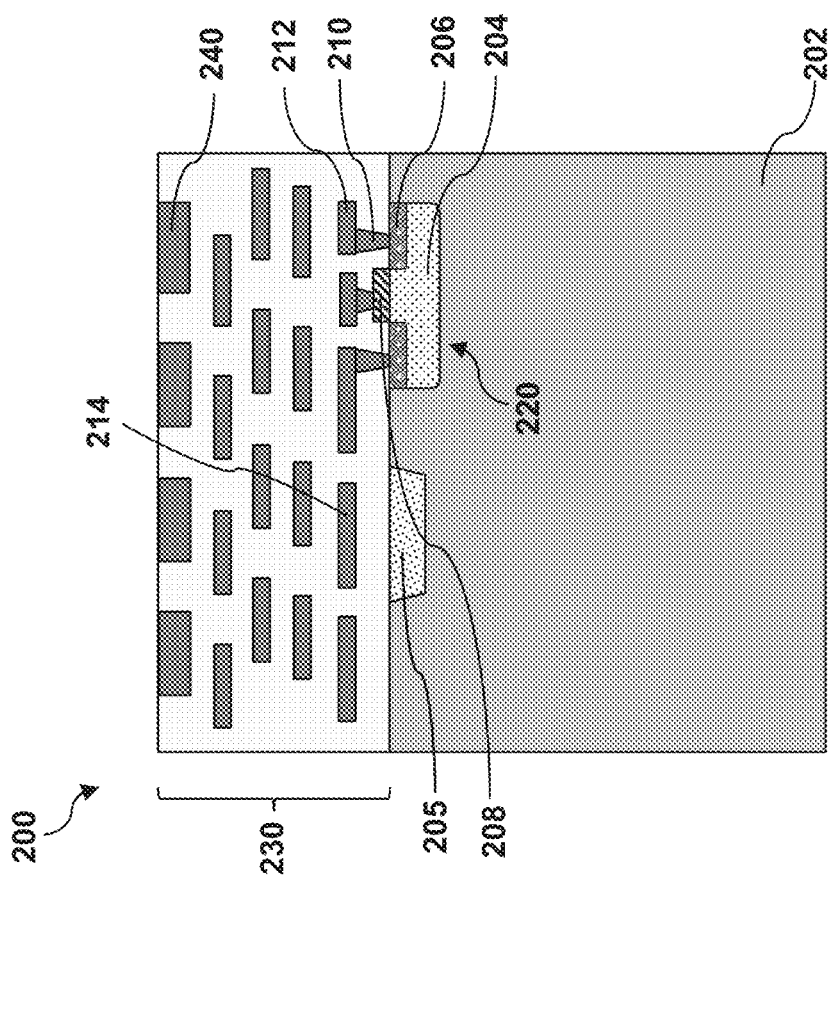
FIGS. 2-14 are fragmentary cross-sectional views of a first wafer, a second wafer or a stacked wafer undergoing operations of the method in FIG. 1, according to various aspects of the present disclosure.
Figure 3:
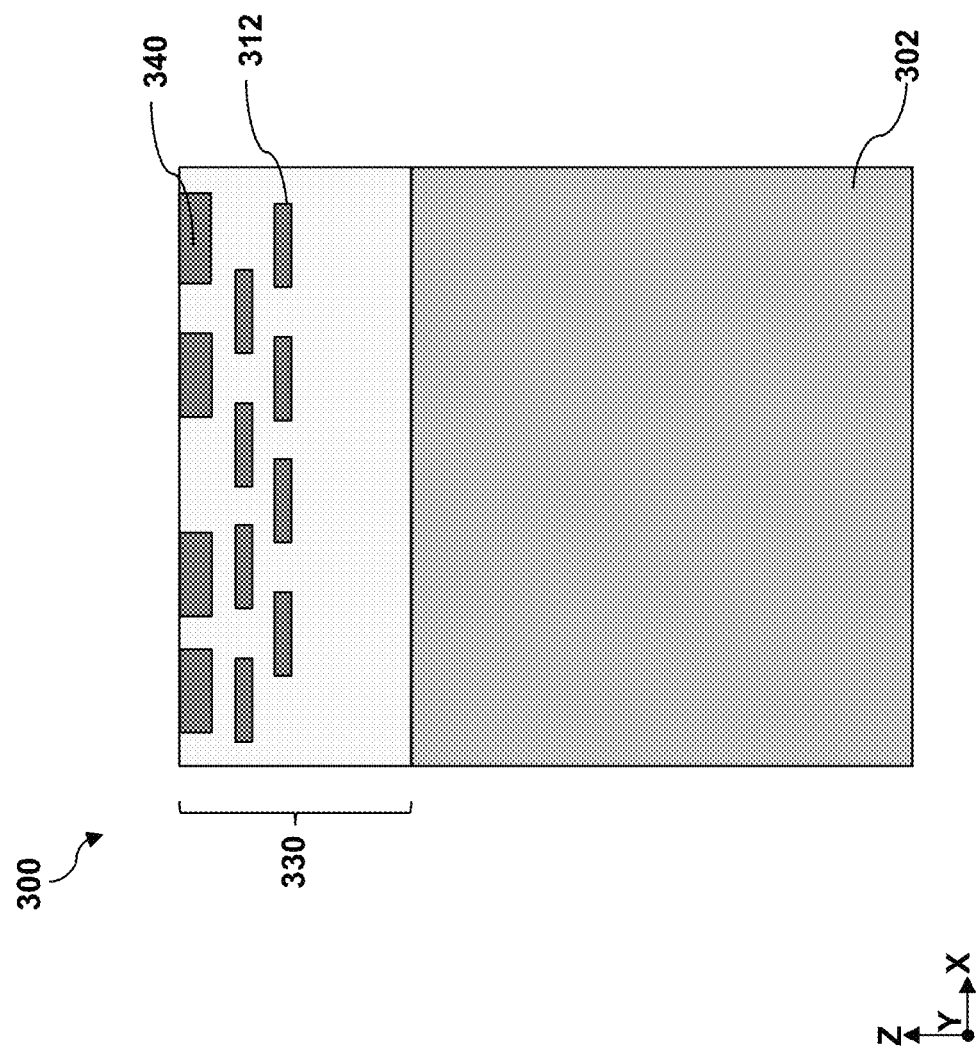

Referring to FIGS. 1, 2 and 3, method 100 includes a block 102 where a first wafer 200 and a second wafer 300 are provided. The first wafer 200 shown in FIG. 2 includes a first substrate 202, a transistor 220 fabricated on the substrate 202, and a first interconnect structure 230 over the first substrate 202. The second wafer 300 shown in FIG. 3 includes a second substrate 302 and a second interconnect structure 330 over the second substrate 302. In an embodiment, both the first substrate 202 and the second substrate 302 include silicon (Si). Alternatively, the first substrate 202 and the second substrate 302 may include a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, the first substrate 202 and the second substrate 302 may be semiconductor-on-insulator substrates, such as a silicon-on-insulator (SOI) substrates, silicon germanium-on-insulator (SGOI) substrates, or germanium-on-insulator (GeOI) substrates. Semiconductor-on-insulator substrates can be fabricated using separation by implantation of oxygen (SIMOX), wafer bonding, and/or other suitable methods. Both the first substrate 202 and the second substrate 302 can include various doped regions (not shown) depending on design requirements. In some implementations, the first substrate 202 and the second substrate 302 include p-type doped regions (for example, p-type wells) doped with p-type dopants, such as boron (for example, $BF_2$), indium, other p-type dopant, or combinations thereof. In some implementations, the first substrate 202 and the second substrate 302 include n-type doped regions (for example, n-type wells) doped with n-type dopants, such as phosphorus (P), arsenic (As), other n-type dopant, or combinations thereof. In some implementations, the first substrate 202 and the second substrate 302 include doped regions formed with a combination of p-type dopants and n-type dopants. The various doped regions can be formed directly on and/or in the first substrate 202 and the second substrate 302, for example, to provide a p-well structure, an n-well structure, a dual-well structure, a raised structure, or combinations thereof. An ion implantation process, a diffusion process, and/or other suitable doping process can be performed to form the various doped regions.

Referring to FIG. 2, the transistor 220 may be a planar transistor or a multi-gate transistor, such as a fin-like field effect transistor (FinFET) or a gate-all-around (GAA) transistor. A planar transistor includes a gate structure that may induce a planar channel region along one surface of its active region, hence its name. A FinFET includes a fin-shaped active region arising from a substrate and a gate structure disposed over a top surface and sidewalls of the fin-shaped active region. A GAA transistor includes at least one channel member extending between two source/drain features and a gate structure that wraps completely around the at least one channel member. Because its gate structure wraps around the channel member, a GAA transistor may also be referred to as a surrounding gate transistor (SGT). Depending on the shapes and orientation, a channel member in a GAA transistor may be referred to as a nanosheet, a semiconductor wire, a nanowire, a nanostructure, a nano-post, a nano-beam, or a nano-bridge. In some instances, a GAA transistor may be referred to by the shape of the channel member. For example, a GAA transistor having one or more nanosheet channel member may also be referred to as a nanosheet transistor or a nanosheet FET. The transistor 220 representatively shown in FIG. 2 is a planar device that includes a gate structure 208 disposed over a channel region of an active region 204 disposed in the first substrate 202. The transistor 220 also includes source/drain regions 206. While the transistor 220 is shown as a planar device in FIG. 2 and subsequent figures, it should be understood that the transistor 220 may as well be a FinFET or a GAA transistor.

While not explicitly shown, the gate structure 208 includes an interfacial layer interfacing the channel region, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HMO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 208 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

The source/drain regions 206 may be doped regions in the active region 204 or epitaxial features deposited using vapor-phase epitaxy (VPE), ultra-high vacuum CVD (UHV-CVD), molecular beam epitaxy (MBE), and/or other suitable processes. When the source/drain regions 206 are n-type, it may include silicon (Si) doped with an n-type dopant, such as phosphorus (P) or arsenic (As). When the source/drain regions 206 are p-type, it may include silicon (Si) or silicon germanium (SiGe) doped with a p-type dopant, such as boron (B) or boron difluoride ($BF_2$).

Although not explicitly shown in FIG. 2, multiple active regions like the active region 204 are formed over the first substrate 202. The active regions may be isolated from one another by an isolation feature. In some implementations, the isolation features may be formed by etching a trench in the first substrate 202 or an epitaxial layer on the first substrate 202 using a dry etch process and filling the trench with insulator material using a chemical vapor deposition (CVD) process, flowable CVD (FCVD) process, or a spin-on glass process. A chemical mechanical polishing (CMP) process may be performed to remove excessive insulator material and to provide a planar surface. When the active regions 204 are semiconductor fins or have fin-like structure, the insulator material is then etched back to form the isolation feature such that the active regions rises above the isolation feature. In some implementations, the isolation features may include a multi-layer structure that includes a liner dielectric layer and bulk dielectric layer. The isolation feature may include silicon oxide, silicon oxynitride, boron silicate glass (BSG), or phosphosilicate glass (PSG). An isolation feature 205 is representatively illustrated in FIG. 2.

Referring to FIG. 2, the first interconnect structure 230 may include eight (8) to sixteen (16) metal layers. While only four metal layers and a top metal layer are shown in FIG. 2 for simplicity, the first interconnect structure 230 may include more metal layers which are omitted. Each of the metal layers includes an etch stop layer (ESL) (not explicitly shown) and an intermetal dielectric (IMD) layer disposed on the ESL. It can be said that ESLs interleave the IMD layers or that IMD layers interleave the ESLs. The ESLs may include silicon carbide, silicon nitride or silicon oxynitride. The IMD layers may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. Example low-k dielectric materials include carbon doped silicon oxide, Xerogel, Aerogel, amorphous fluorinated carbon, benzocyclobutene (BCB), or polyimide.

Referring still to FIG. 2, each of the metal layers and the top metal layer of the first interconnect structure 230 includes a plurality of vertically extending vias and horizontally metal lines. By way of example, a contact via 210, a first metal line 212, a second metal line 214, and a top metal feature 240 are illustrated in FIG. 2. The contact via 210, the first metal line 212 and the second metal line 214 are disposed in the first metal layer, which is the metal layer closest to the transistor 220. The top metal feature 240 is disposed in the top metal layer and is exposed on a top surface of the first interconnect structure 230. As shown in FIG. 2, the first interconnect structure 230 also include other contact vias, metal lines and top metal features that are not separately labeled. The contact vias and metal lines may include copper (Cu), tantalum (Ta), nickel (Ni), cobalt (Co), aluminum (Al), or a combination thereof. In one embodiment, the contact vias, metal lines, and the top metals may include copper (Cu). The top metal feature 240 may include copper (Cu), aluminum (Al), or an alloy thereof. In one embodiment, the top metal feature 240 may include an alloy of aluminum and copper. While not explicitly shown, the contact vias, metal lines and top metal features may further include a barrier layer to interface the oxygen-containing IMDs. The barrier layer may include titanium nitride (TiN), tantalum nitride (TaN), manganese nitride (MnN), or other transition metal nitride.

Reference is now made to FIG. 3. The second substrate 302 may include a transistor or a memory device. For example, the second substrate 302 may include a logic transistor similar to the logic transistor 220 in the first substrate 202. Alternatively, the second substrate 302 may include a memory device, such as a dynamic random access memory (DRAM) device. The second interconnect structure 330 may include eight (8) to sixteen (16) metal layers. For ease of illustration, the second interconnect structure 330 in FIG. 3 only include two metal layers and a top metal layer. It should be understood that the second interconnect structure 330 may include several additional metal layers. Like the first interconnect structure 230, each of the metal layers includes an etch stop layer (ESL) (not explicitly shown) and an intermetal dielectric (IMD) layer disposed on the ESL. It can be said that ESLs interleave the IMD layers or that IMD layers interleave the ESLs. The ESLs may include silicon carbide, silicon nitride or silicon oxynitride. The IMD layers may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. Example low-k dielectric materials include carbon doped silicon oxide, Xerogel, Aerogel, amorphous fluorinated carbon, benzocyclobutene (BCB), or polyimide.

Referring still to FIG. 3, each of the metal layers and the top metal layer in the second interconnect structure 330 includes a plurality of vertically extending vias and horizontally metal lines. By way of example, a metal line 312 and a top metal feature 340 are illustrated in FIG. 3. The metal line 312 is disposed in the first metal layer, which is the metal layer closest to the second substrate 302. The top metal feature 340 is disposed in the top metal layer and is exposed on a top surface of the second interconnect structure 330. As shown in FIG. 3, the second interconnect structure 330 also include other contact vias, metal lines and top metal features that are not separately labeled. The contact vias, metal lines, and top metal features in the second interconnect structure 330 may include copper (Cu), tantalum (Ta), nickel (Ni), cobalt (Co), aluminum (Al), or a combination thereof. While not explicitly shown, the contact vias, metal lines and top metal features may further include a barrier layer to interface the oxygen-containing IMDs. The barrier layer may include titanium nitride (TiN), tantalum nitride (TaN), manganese nitride (MnN), or other transition metal nitride.

Figure 4:
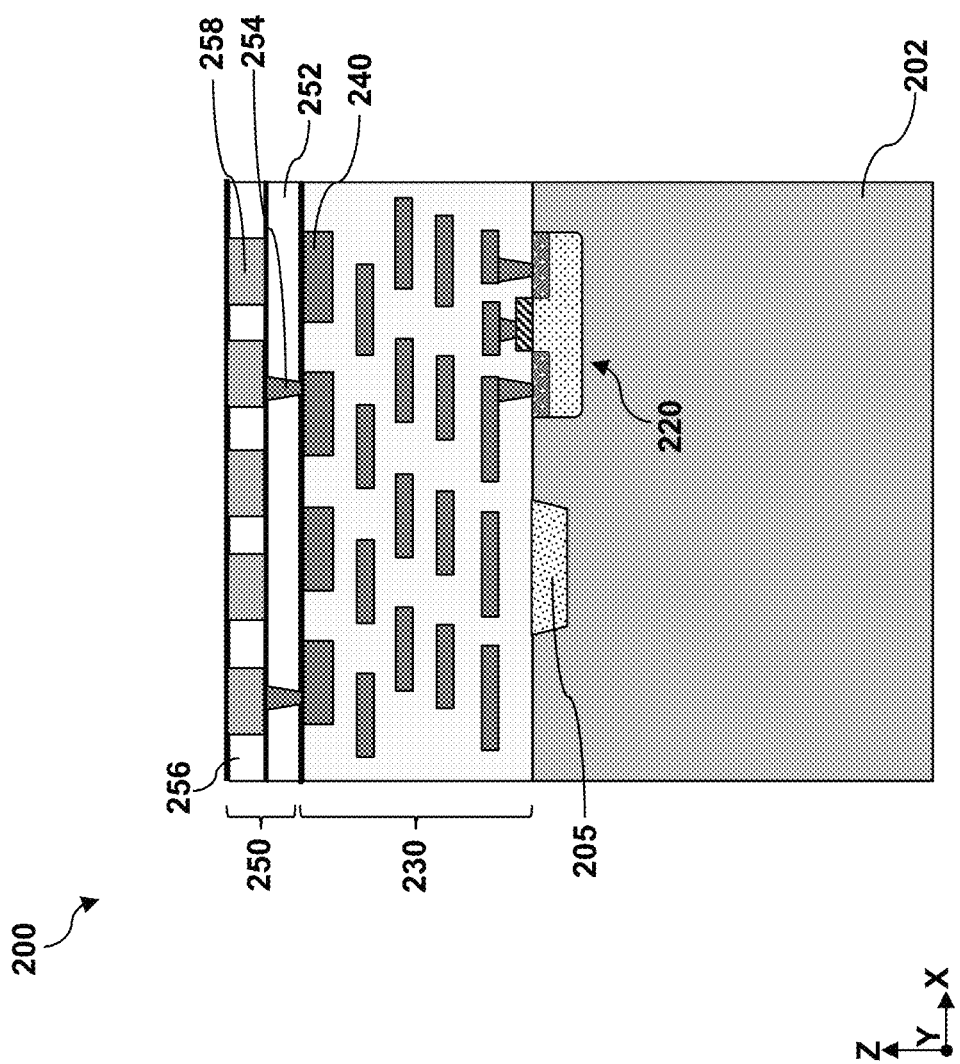
Figure 5:
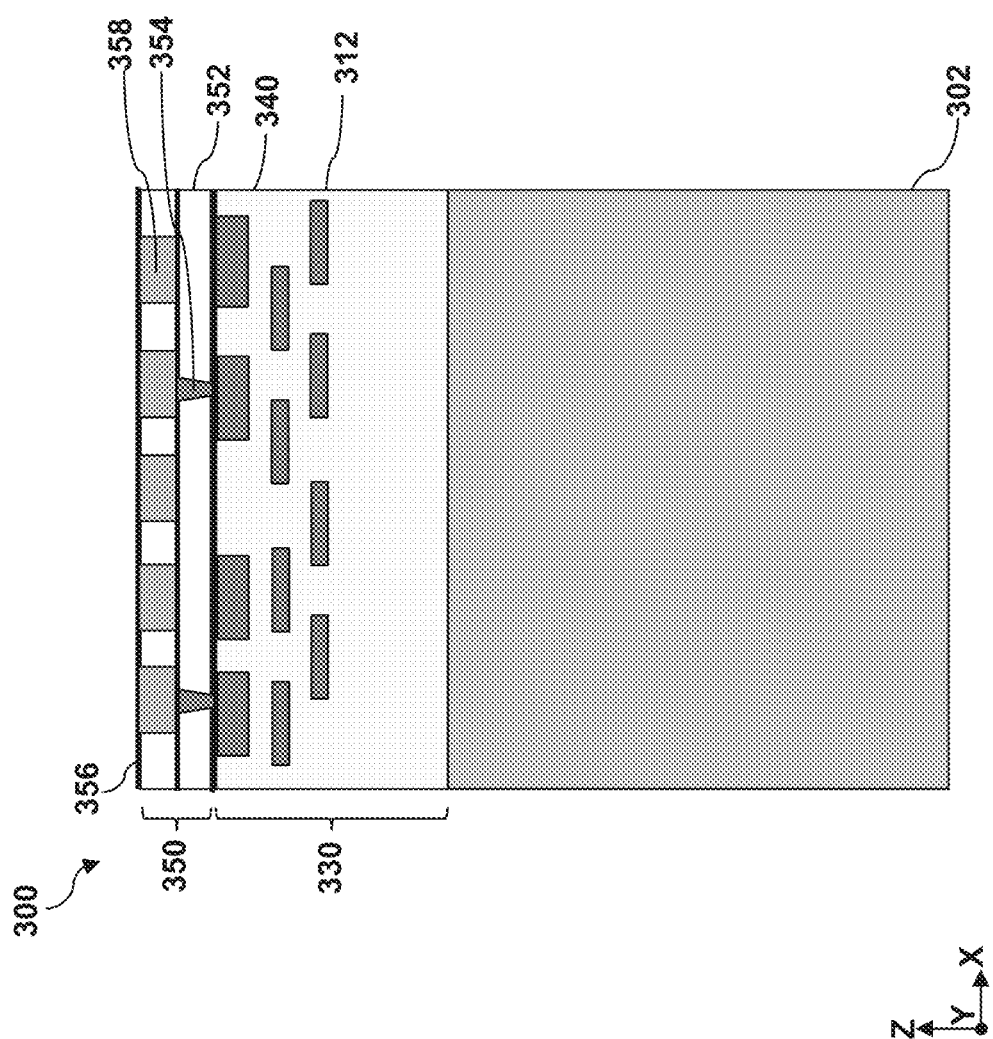

Referring to FIGS. 1, 4 and 5, method 100 includes a block 104 where a first bonding layer 250 is formed over the first wafer 200 and a second bonding layer 350 is formed over the second wafer 300. One of the functions of the first bonding layer 250 and the second bonding layer 350 is to provide an aligned communication interface. The first wafer 200 and the second wafer 300 have different top metal patterns. That is, when the first wafer 200 is flipped upside down, the top metal features 240 on the first wafer 200 will not align with the top metal features 340 on the second wafer 300. The first bonding layer 250 and the second bonding layer 350 redirect patterns of the top metal features on the first wafer 200 and the second wafer 300 to achieve direct wafer-to-wafer communication. Additionally, direct wafer bonding requires a high level of wafer surface planarity and a high density of dummy and functional bonding metal features. The top metal layers of the first wafer 200 and the second wafer 300 do not have the requisite metal feature density for direct wafer bonding processes. Referring to FIG. 4, the first bonding layer 250 includes first contact vias 254 disposed in a first dielectric layer 252 and first bonding pads 258 disposed in a second dielectric layer 256. The first dielectric layer 252 and the second dielectric layer 256 may have a composition similar to the IMD layers described above. The first contact vias 254 and the first bonding pads 258 may include copper (Cu), tantalum (Ta), nickel (Ni), cobalt (Co), aluminum (Al), a combination thereof, or an alloy thereof. In one embodiment, the first contact vias 254 and the first bonding pads 258 may include copper (Cu) and are a continuous structure. Similarly, the second bonding layer 350 shown in FIG. 5 includes second contact vias 354 disposed in a third dielectric layer 352 and second bonding pads 358 disposed in a fourth dielectric layer 356. The third dielectric layer 352 and the fourth dielectric layer 356 may share the same composition with the first dielectric layer 252 and the second dielectric layer 256. The second contact vias 354 and the second bonding pads 358 share the same composition with the first contact vias 254 and the first bonding pads 258. In some embodiments, etch stop layers may be disposed between the interconnect structure (230 or 330) and the dielectric layer (252 or 352), between the dielectric layers (between 252 and 256 or between 352 and 356), or over the top dielectric layer (256 or 356) to provide etch end point control or to provide electromigration suppression. The etch stop layers may include silicon carbide, silicon oxynitride or silicon nitride. To facilitate the subsequent wafer bonding process, the topmost etch stop layer over the second dielectric layer 256 or the fourth dielectric layer 356 may include silicon oxynitride.

Figure 6:
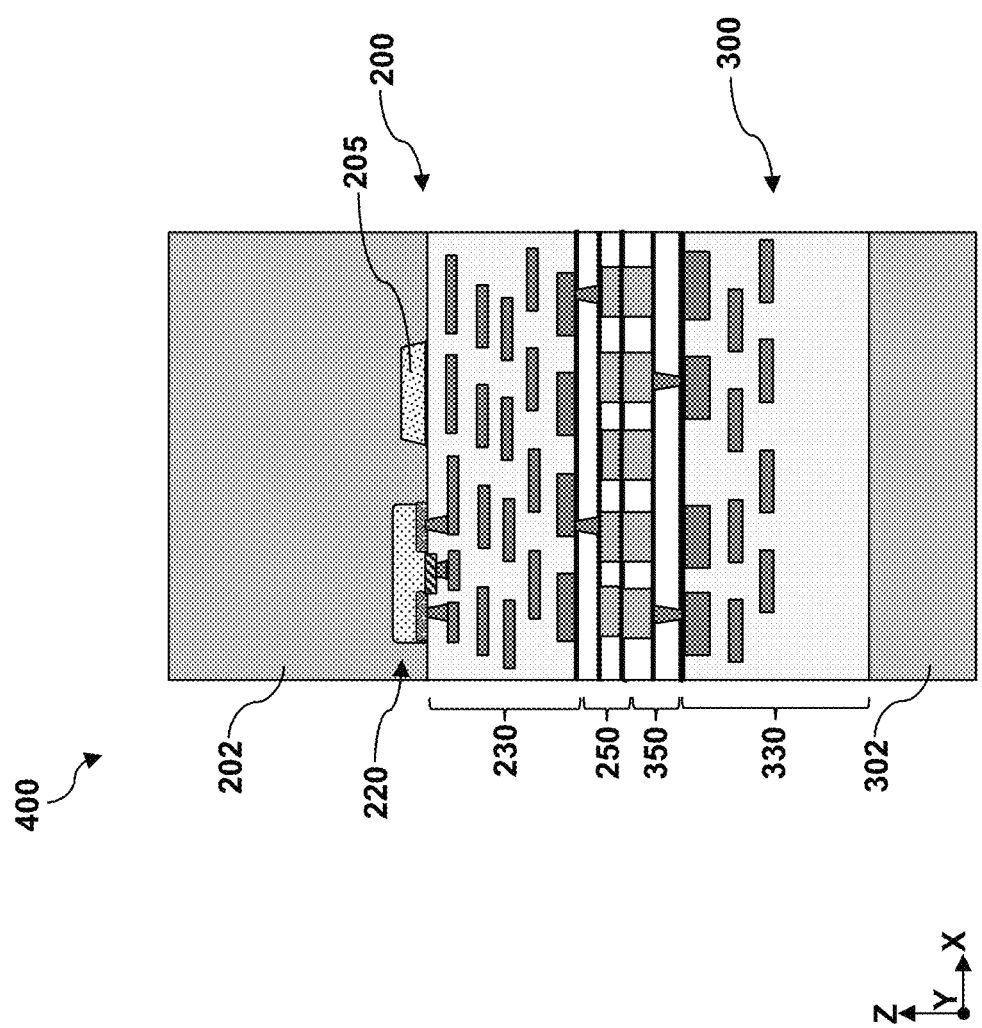

Referring to FIGS. 1 and 6, method 100 includes a block 106 where the first wafer 200 is bonded to the second wafer 300 by bonding the first bonding layer 250 and the second bonding layer 350. At block 106, the first wafer 200, along with the first bonding layer 250, is flipped upside down and bonded to the second wafer 300 to define a wafer stack 400 or a multi-tier semiconductor structure 400. To ensure a strong bonding between the first bonding layer 250 and the second bonding layer 350, surfaces of the first bonding layer 250 and the second bonding layer 350 are cleaned to remove organic and metallic contaminants. In an example process, a sulfuric acid hydrogen peroxide mixture (SPM), a mixture of ammonium hydroxide and hydrogen peroxide (SC1), or both are used to remove organic contaminants on the first bonding layer 250 and the second bonding layer 350. A mixture of hydrochloric acid and hydrogen peroxide (SC2) may be used to remove metallic contaminants. Besides cleaning, the first bonding pads 258 and the second bonding pads 358 may be treated by an argon plasma or a nitrogen plasma to activate the surfaces thereof. After the second bonding pads 358 in second bonding layer 350 is aligned with the first bonding pads 258 in the first bonding layer 250, an anneal is performed to promote the van der Waals force bonding of the second dielectric layer 256 and the fourth dielectric layer 356 (or top etch stop layers on the second dielectric layer 256 or the fourth dielectric layer 356) as well as the surface-activated bonding (SAB) of the first bonding pads 258 and the second bonding pads 358. In some instances, the anneal includes a temperature between about 200° C. and about 300° C. As shown in FIG. 6, the first substrate 202 is on top of the wafer stack 400. Because the first wafer 200 in the wafer stack 400 is now flipped upside down, a top surface of the isolation feature 205 is higher than the first interconnect structure 230.

Figure 7:
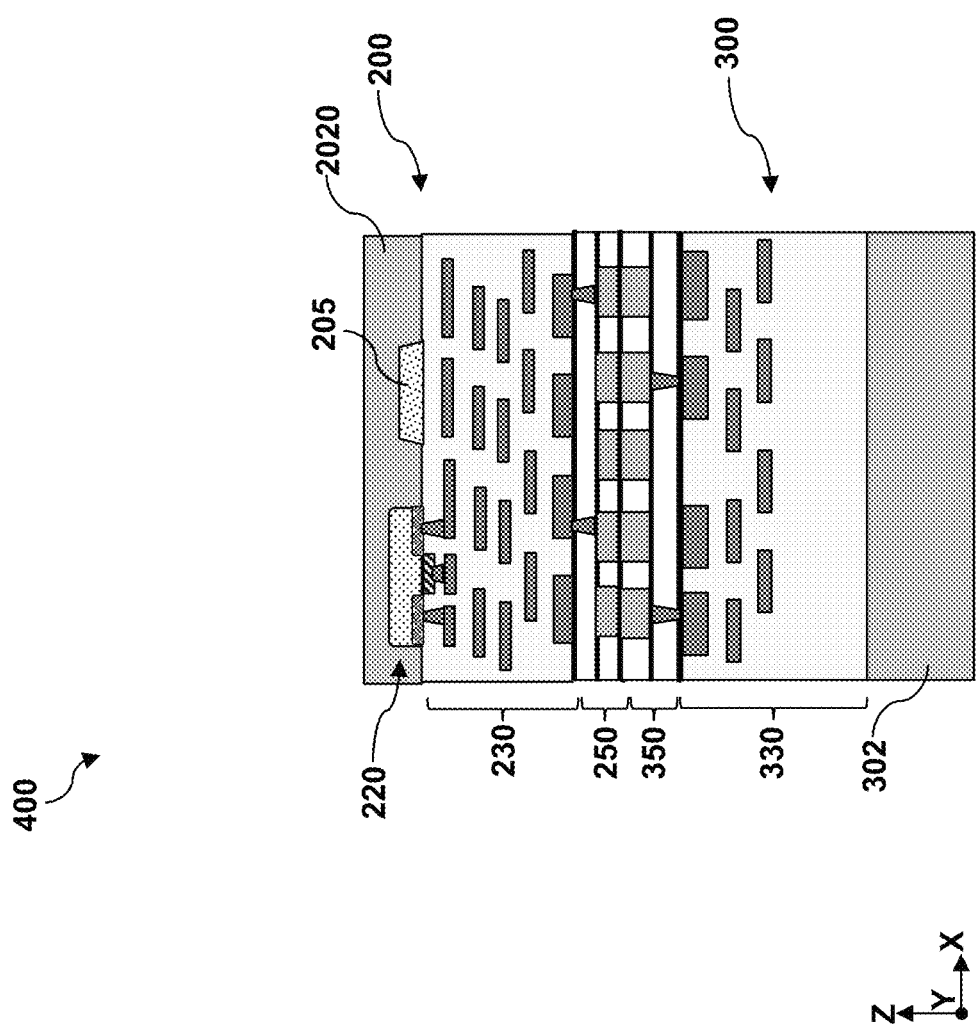

Referring to FIGS. 1 and 7, method 100 includes a block 108 where the first substrate 202 of the first wafer 200 is thinned to form a thinned first substrate 2020. In some embodiments, the wafer stack 400 may undergo multiple thinning and polishing steps to reduce the thickness of the second substrate 302. In an example process, diamond wheels may be used to perform coarse grinding, fine grinding, or super fine grinding and a chemical mechanical polishing (CMP) process may be performed to polishing the ground first substrate 202. In some embodiments, the first substrate 202 may be thinned a total thickness of the first substrate 202 is between about 2.8 µm and about 6.0 µm. The thickness of the first substrate 202 is directly related to electrical isolation required based on the application. When the transistor 220 is a logic device that operates at a relative low operating voltage, the first substrate 202 may have a smaller thickness between about 2.8 µm and about 4.0 µm. When the transistor 220 is a high voltage device that operates at a relatively high operating voltage, the first substrate 202 may have a greater thickness between about 4.0 µm and about 6.0 µm. As described above, the thinning process may introduce dangling bond effect in the thinned first substrate 2020. Dangling bonds are electrically active defects that lead to mid-gap states and leakage paths.

Figure 8:
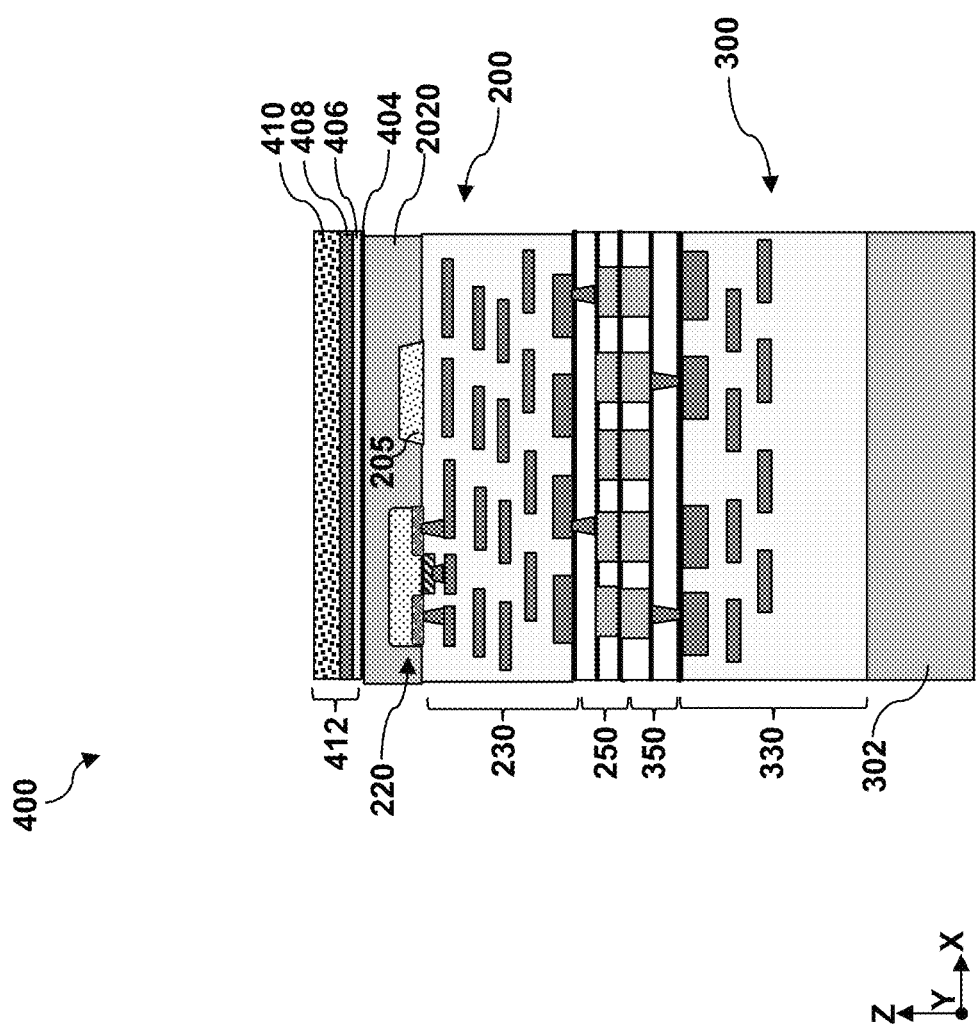

Referring to FIGS. 1 and 8, method 100 includes a block 110 where a protective film 412 is formed over the first substrate 202. In some embodiments represented by FIG. 8, the protective film 412 is a multi-layer that includes an interfacial layer 404, a first high-k dielectric layer 406 over the interfacial layer 404, a second high-k dielectric layer 408 over the first high-k dielectric layer 406, and a top oxide layer 410 over the second high-k dielectric layer 408. As used herein, a high-k dielectric material refers to a dielectric material having a dielectric constant (k) greater than that of silicon oxide, which is about 3.9. These sublayers in the protective film 412 have different functions. The interfacial layer 404 serves as a buffer layer between the high-k dielectric material in the first high-k dielectric layer 406 and the semiconductor material in the first substrate 2020. In some embodiments, the interfacial layer 404 may include silicon oxide. The first high-k dielectric layer 406 functions to introduce a built-in negative fixed charge, which can cause accumulation of positive charge in the first substrate 2020, thereby counteracting the effect of the dangling bond defects. The first high-k dielectric layer 406 may be deposited at a temperature between about 150° C. and about 300° C. using ALD, remote plasma ALD (RPALD), or CVD.

In some embodiments, the first high-k dielectric layer 406 may include a metal oxide layer, such as an aluminum oxide layer, a titanium oxide layer, a zirconium oxide layer, or a combination thereof. Researches have shown that these materials, when interfacing a silicon oxide layer, tend to have strong interface dipole moments. The dangling bond neutralizing power of the first high-k dielectric layer 406 may be quantified as a flat band ($V_{FB}$) voltage shift. In generally, a stronger interface dipole moment and a greater thickness can collectively lead to a greater flat band voltage shift until the thickness reaches a point where thickness increases stop contributing to flat band voltage shift (due to distance from the interface). Based on experimental data, a minimum flat band voltage shift to sufficiently neutralize the dangling bond defects is about 0.4V. According to the present disclosure, the first high-k dielectric layer 406 may generate a flat band voltage shift greater than 0.4V. For example, when the first high-k dielectric layer 406 is formed of aluminum oxide and has a thickness of about 60 Å, the flat band voltage shift is about 1.4 V. When the first high-k dielectric layer 406 is formed of aluminum oxide and has a thickness of about 30 Å, the flat band voltage shift is about 1.15 V. In some embodiments, the first high-k dielectric layer 406 has a thickness between about 15 Å and about 55 Å and may still provide a flat band voltage shift equal to or greater than 0.4 V. This thickness range is not trivial. When the thickness of the first high-k dielectric layer 406 is smaller than 15 Å, it is very difficult to ensure homogeneity of the first high-k dielectric layer 406 across the entire first substrate 202 of the first wafer 200. When the thickness of the first high-k dielectric layer is greater than 55 Å, the benefit of having a thin first high-k dielectric layer 406 is diminishing or nonexistent. When the first high-k dielectric layer 406 is kept thin (e.g., smaller than 60 Å), the deposition cycle time may be reduced and throughput (i.e., wafer-per-hour (WPH)) may be increased. This is especially true when the first high-k dielectric layer 406 is deposited using ALD, which has a slow deposition rate but tends to provide better crystallinity in the as-deposited layer. Because the first high-k dielectric layer 406 of the present disclosure induces a dipole moment, it may also be referred to as a dipole-inducing layer 406.

The second high-k dielectric layer 408 is a dense layer that functions as a moisture barrier. It has been observed that when water ingresses into the first high-k dielectric layer 406, the flat band voltage shift can be greatly reduced. The second high-k dielectric layer 408 prevents water from entering into the first high-k dielectric layer 406. In some embodiments, the second high-k dielectric layer 408 may include tantalum oxide. The top oxide layer 410 serves as a hard mask for the subsequent via opening formation processes. In some embodiments, the top oxide layer 410 may be an undoped silicate glass (USG) layer, which includes silicon oxide. In some embodiments, the interfacial layer 404 has a thickness between about 15 Å and about 25 Å. The second high-k dielectric layer 408 has to be sufficiently thick to serve as a moisture barrier. In some embodiments, the thickness of the second high-k dielectric layer 408 may be between about 400 Å and about 600 Å. When both the first high-k dielectric layer 406 and the second high-k dielectric layer 408 are formed of metal oxides, they may also be referred to as a first metal oxide layer 406 and a second metal oxide layer 408.

Figure 9:
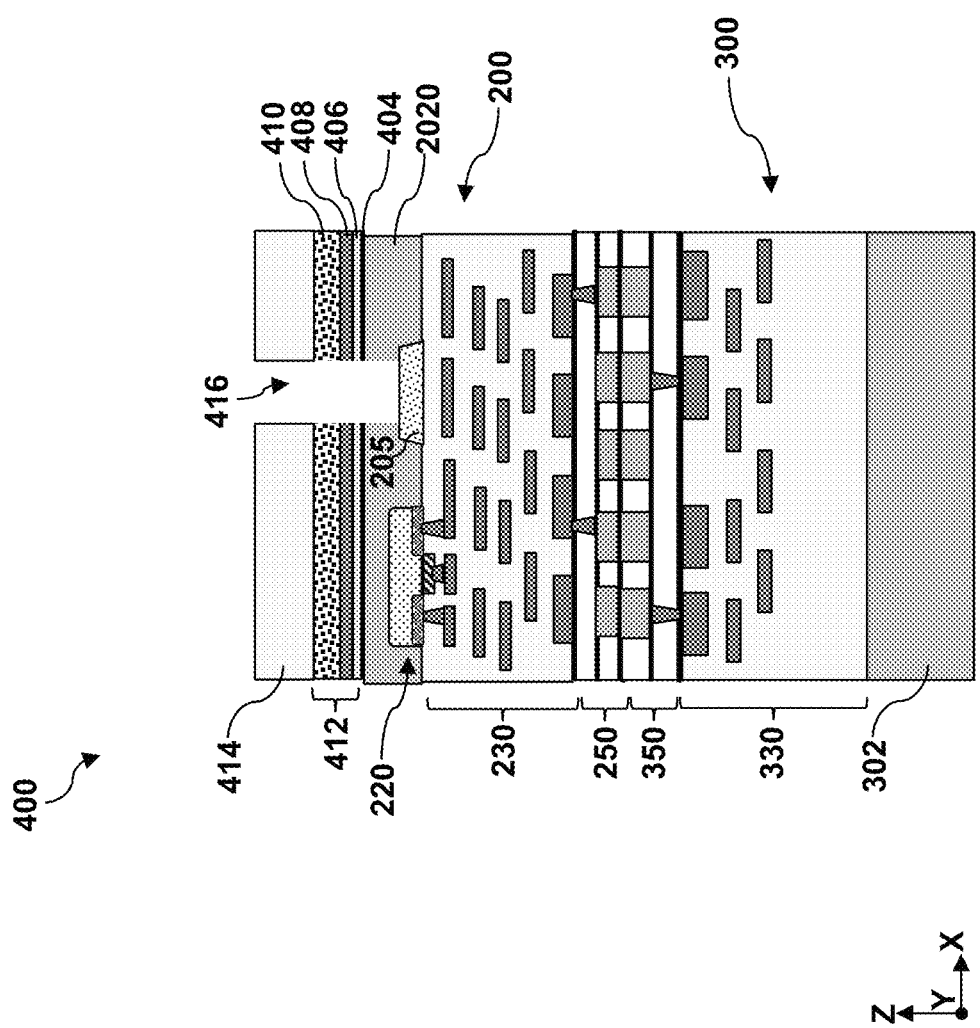

Referring to FIGS. 1 and 9, method 100 includes a block 112 where a backside via opening 416 is formed through the protective film 412 and a portion of the first substrate 202 to expose a top surface of the isolation feature 205. In an example process, a photoresist layer 414 is deposited over the top oxide layer 410 using spin-on coating. The deposited photoresist layer 414 may undergo a pre-exposure baking process, exposure to radiation reflected from or transmitted through a photomask, a post-exposure baking process, and developing process, so as to form a patterned photoresist. The top oxide layer 410, the second high-k dielectric layer 408, the first high-k dielectric layer 406, the interfacial layer 404, the first substrate 202, and a portion of the isolation feature 205 are then etched using the patterned photoresist layer 414 to expose the isolation feature 205 in the backside via opening 416. The etching of the top oxide layer 410, the second high-k dielectric layer 408, the first high-k dielectric layer 406, the interfacial layer 404, the first substrate 202, and the portion of the isolation feature 205 may include a dry etch process, a wet etch process, or a combination thereof. In some instances, different etch processes or different etchant chemistries may be used. After formation of the backside via opening 416, the residual patterned photoresist layer 414 may be removed by ashing, stripping, or selective etching.

Figure 10:
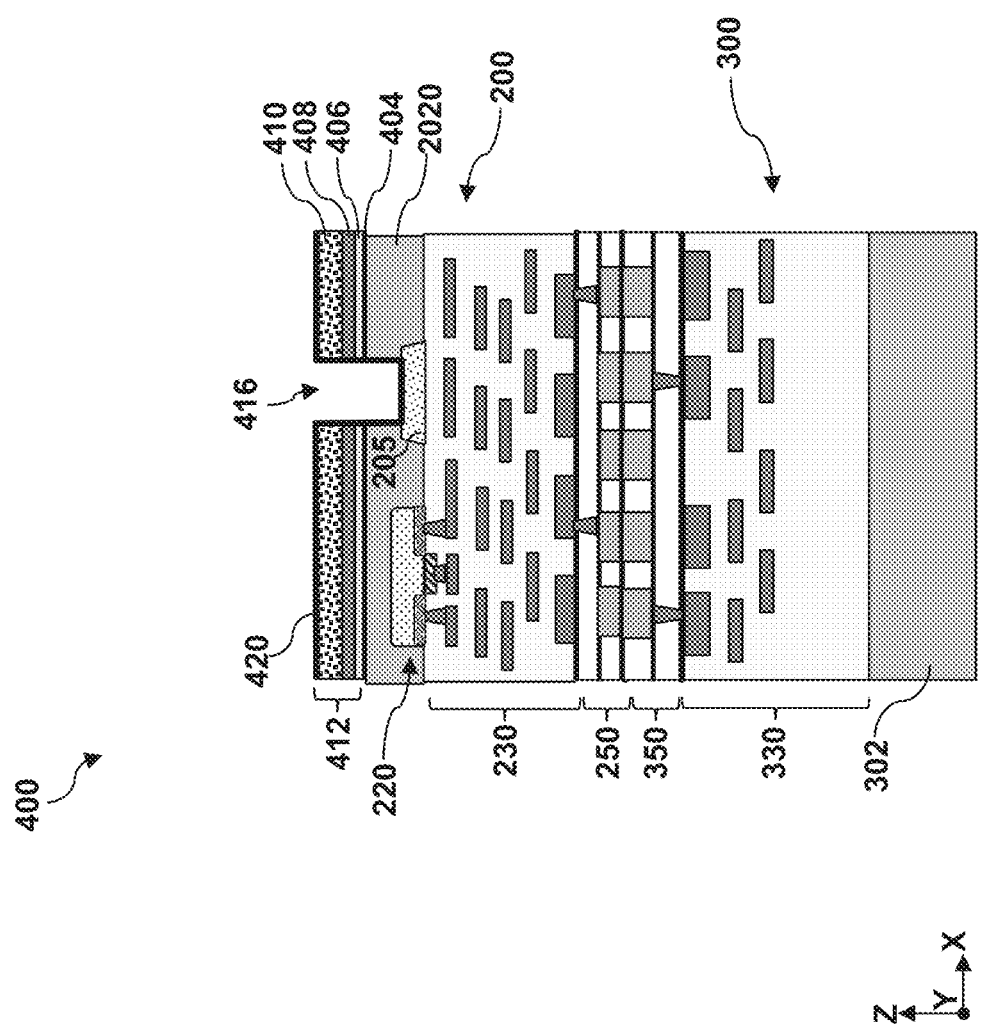
Figure 11:
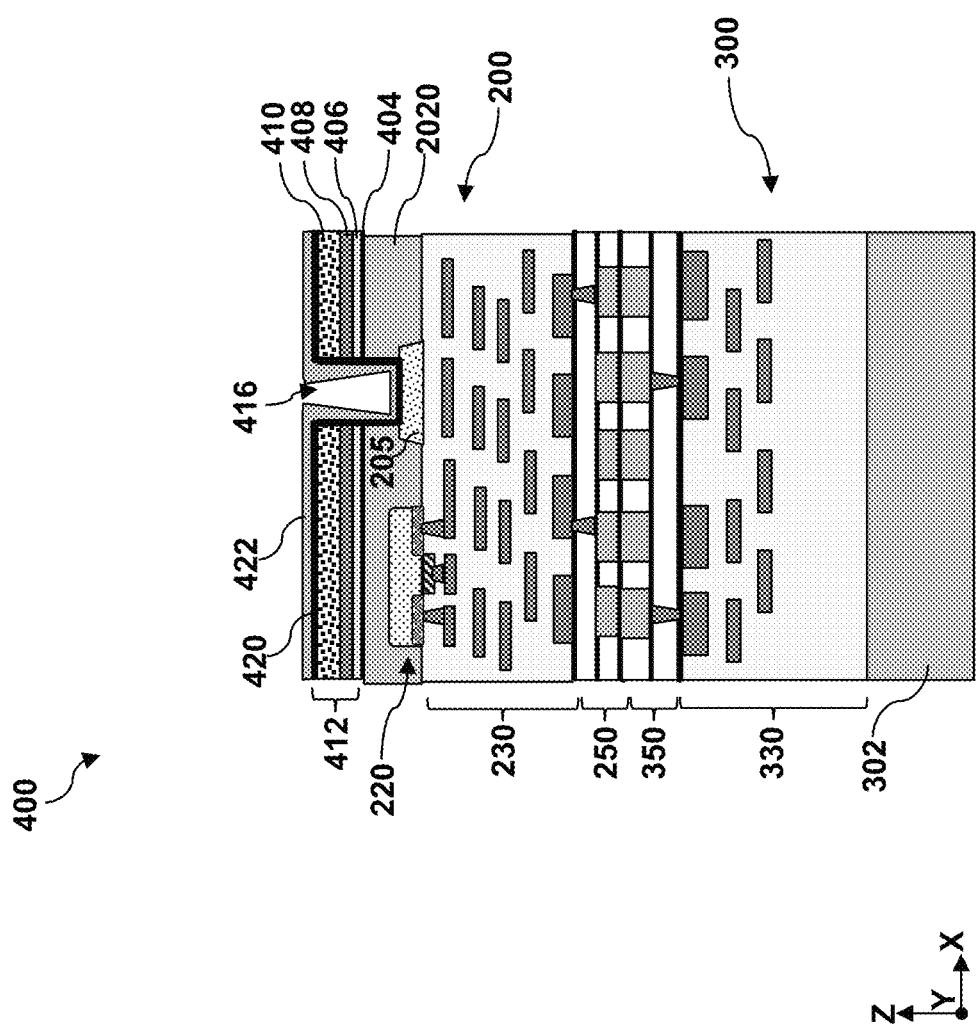
Figure 12:
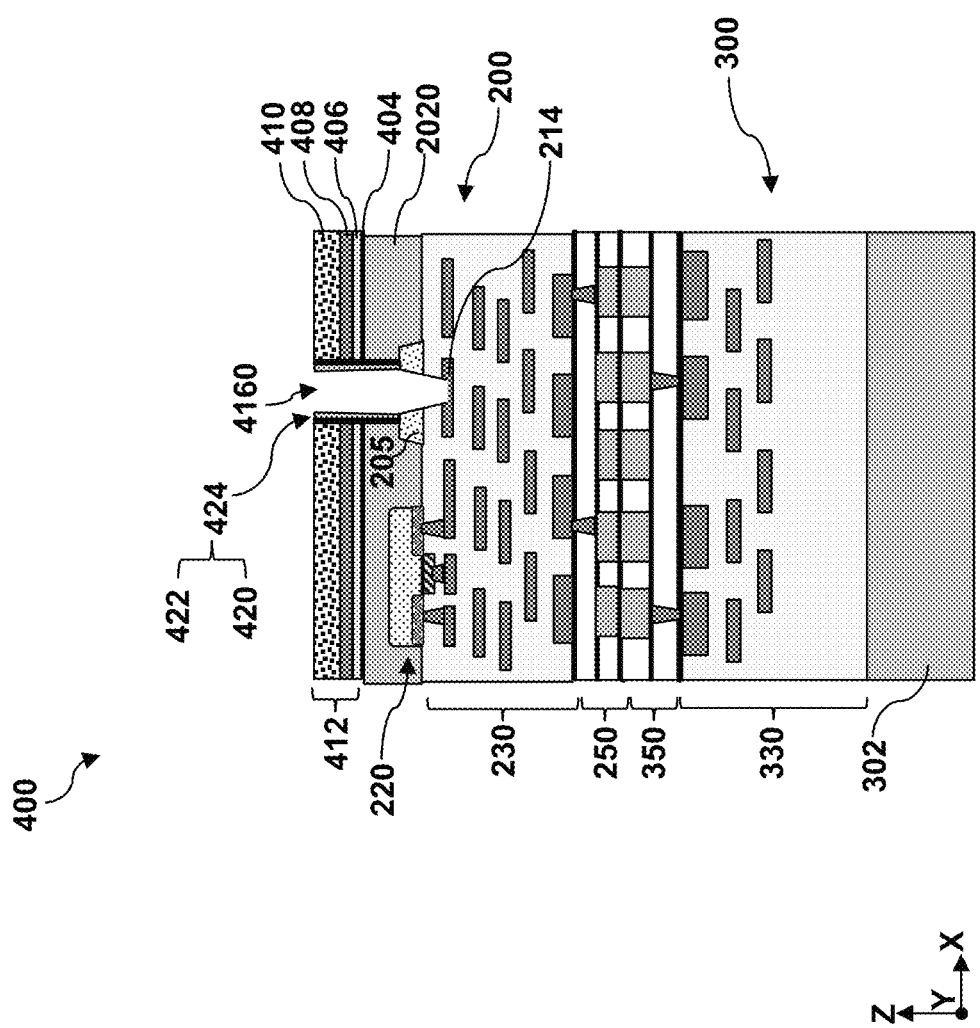

Referring to FIGS. 1, 10, 11, and 12, method 100 includes a block 114 where a via liner 424 is formed over sidewalls of the backside via opening 416. Operations at block 114 may include deposition of a first liner material 420 (shown in FIG. 10), deposition of a second liner material 422 (shown in FIG. 11), and etching back of the first liner material 420 and the second liner material 422 to form the via liner 424 (shown in FIG. 12). Referring to FIG. 10, the first liner material 420 and the second liner material 422 are sequentially and conformally deposited over the wafer stack 400, including over the protective film 412 and the backside via opening 416. In some embodiments, the first liner material 420 may include silicon oxide and the second liner material 422 may include silicon nitride. The first liner material 420 and the second liner material 422 may be deposited using chemical vapor deposition (CVD), atomic layer deposition (ALD), or a suitable method. As representatively shown in FIG. 11, the first liner material 420 and the second liner material 422 may deposit faster and accumulate to a greater thickness around top edges of the backside via opening 416. After deposition of the first liner material 420 and the second liner material 422, the wafer stack 400 is anisotropically such that the first liner material 420 and the second liner material 422 on the top surface of the top oxide layer 410 are removed and the backside via opening 416 is extended through the isolation feature 205 and an IMD layer of the first interconnect structure 230 to expose the second metal line 214. After the anisotropic etch, the backside via opening 416 becomes an extended backside via opening 4160 The anisotropic etch may be a dry etch process that includes use of an oxygen-containing gas (e.g., $O_2$), a fluorine-containing gas (e.g., $SF_6$ or $NF_3$), a chlorine-containing gas (e.g., $Cl_2$ and/or $BCl_3$), a bromine-containing gas (e.g., HBr), an iodine-containing gas, other suitable gases and/or plasmas, and/or combinations thereof. The etch back leaves behind the via liner 424 extending along sidewalls of the backside via opening 416 shown in FIG. 12. As shown in FIG. 12, the via liner 424 is in direct physical contact with the top oxide layer 410, the second high-k dielectric layer 408, the first high-k dielectric layer 406, the interfacial layer 404, the first substrate 202, and the isolation feature 205. Particularly, the via liner 424 includes an inner layer 422 (the same reference numeral is used for ease of reference) formed from the second liner material 422 and an outer layer 420 (the same reference numeral is used for ease of reference) formed from the first liner material 420. The outer layer 420 is in direct contact with the top oxide layer 410, the second high-k dielectric layer 408, the first high-k dielectric layer 406, the interfacial layer 404, the first substrate 202, and the isolation feature 205. The inner layer 422 is in direct contact with isolation feature 205 but is spaced apart from the top oxide layer 410, the second high-k dielectric layer 408, the first high-k dielectric layer 406, the interfacial layer 404, the first substrate 202 by the outer layer 420.

Figure 13:
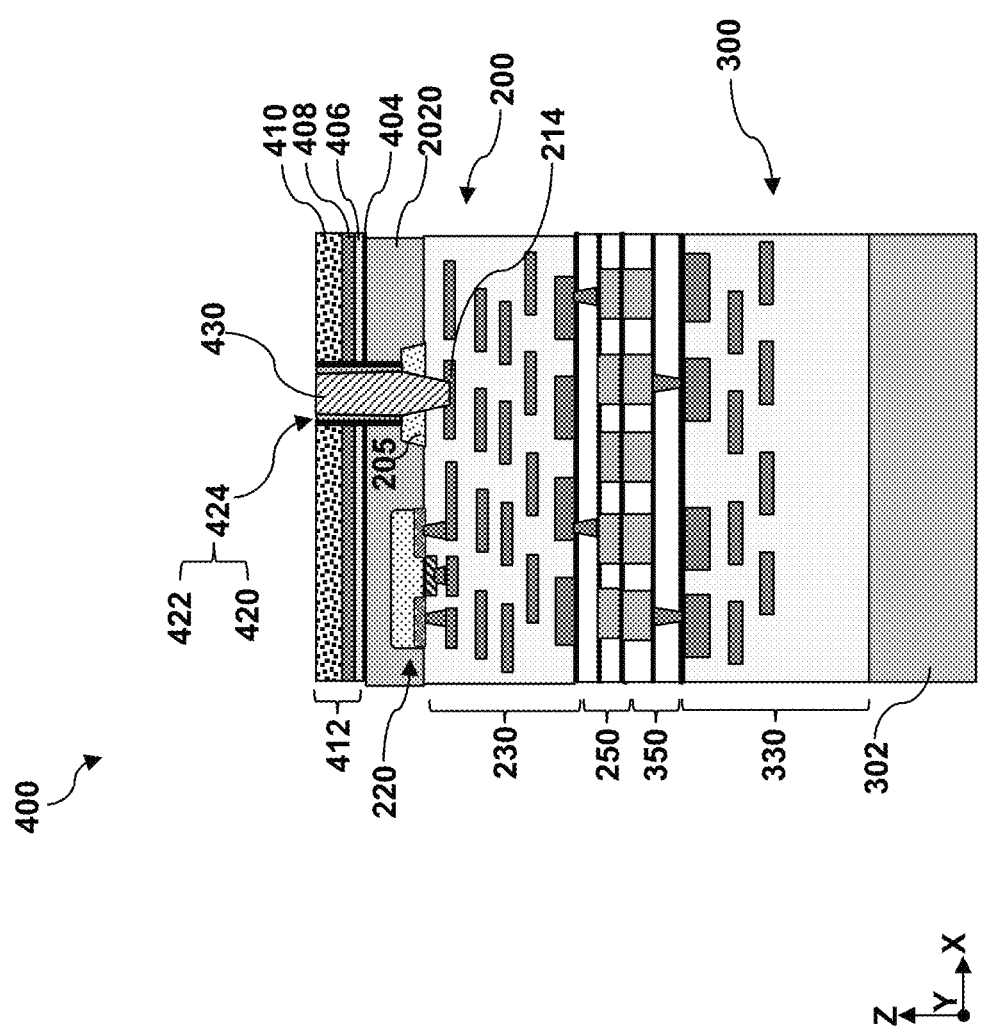

Referring to FIGS. 1 and 13, method 100 includes a block 116 where a backside through substrate via (BTSV) 430 is formed in the extended backside via opening 4160. After the formation of the via liner 424, a metal material is deposited over the wafer stack 400, including over the extended backside via opening 4160. The metal material may include copper (Cu), nickel (Ni), cobalt (Co), aluminum (Al), a combination thereof, or an alloy thereof. In one embodiment, the metal material for block 116 may include copper (Cu). When the metal material is copper (Cu), a seed layer is first deposited in the extended backside via opening 4160 by physical vapor deposition (PVD) and then an electroplating process is performed to deposit the metal material over the seed layer in the extended backside via opening 4160. In some embodiments not explicitly shown in the figures, a barrier layer is formed in the extended backside via opening 4160 before the deposition of the metal material. In some instances, the barrier layer may include titanium nitride (TiN), tantalum nitride (TaN), manganese nitride (MnN), or other transition metal nitride. In one embodiment, the barrier layer includes tantalum nitride. The barrier layer may be regarded as part of the BTSV 430. A planarization process, such as a CMP process, is performed to remove excess material from the top surface of the top oxide layer 410 to form the BTSV 430. In some embodiments, the BTSV 430 may have a circular cross section from a top view and have a diameter between about 0.5 µm and about 4 µm.

Figure 14:
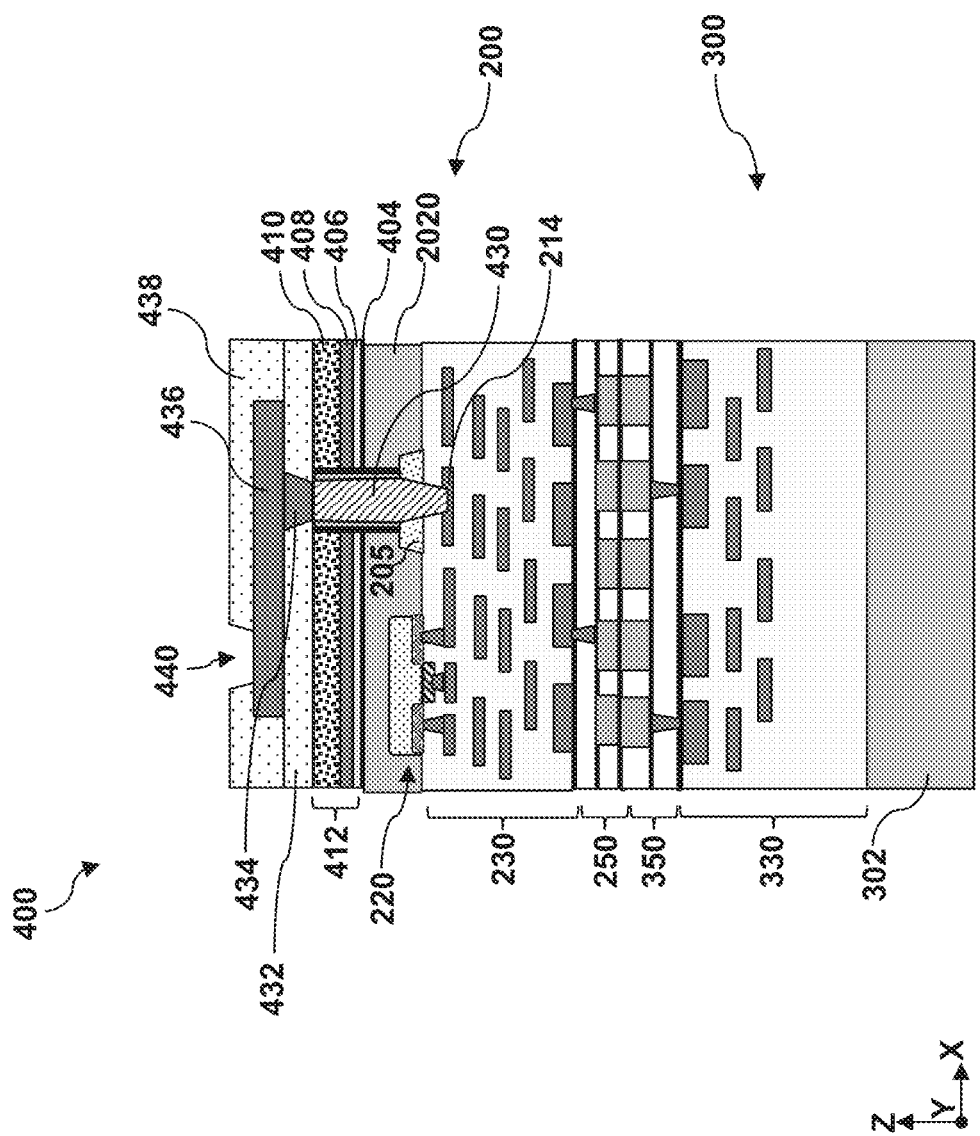

Referring to FIGS. 1 and 14, method 100 includes a block 118 where further processes are performed. Such further processes may include formation of a passivation structure and a bond pad. In an example process, a first passivation layer 432 is deposited over the top oxide layer 410 and the BTSV 430. A redistribution via opening is then formed through the first passivation layer 432 to expose the BTSV 430. A metal layer is then deposited over the redistribution via opening and the first passivation layer 432. Afterwards, the metal layer is patterned to form the redistribution via 434 and the bond pad 436. A second passivation layer 438 is then deposited over the first passivation layer 432 and the bond pad 436. A bump opening 440 is formed through the second passivation layer 438 to expose the bond pad 436. In some embodiments, the first passivation layer 432 and the second passivation layer 438 may include silicate glass (USG), borophosphosilicate glass (BPSG), or the like. In some instances, an etch stop layer may be deposited over the wafer stack 400 before the deposition of the first passivation layer 432. The etch stop layer may include an oxygen-free dielectric material, such as silicon nitride, silicon carbide, or silicon carbonitride. The metal layer that forms the redistribution via 434 and the bond pad 436 may include aluminum (Al), copper (Cu), or an aluminum-copper alloy. The bump opening 440 is configured to receive a bump structure that includes an under-bump-metallization (UBM) and a solder bump. While not explicitly shown in the figures, after the formation of the passivation structure, the wafer stack 400 is diced in a singulation process to form package structures that include stacked chips or stack dies.

The present disclosure also includes alternative embodiments to fulfill the functions of the first high-k dielectric layer 406 and the second high-k dielectric layer 408. These alternative embodiments will be described in conjunction with the schematic drawings in FIGS. 15-20 and the flowchart in FIG. 1.

Figure 15:
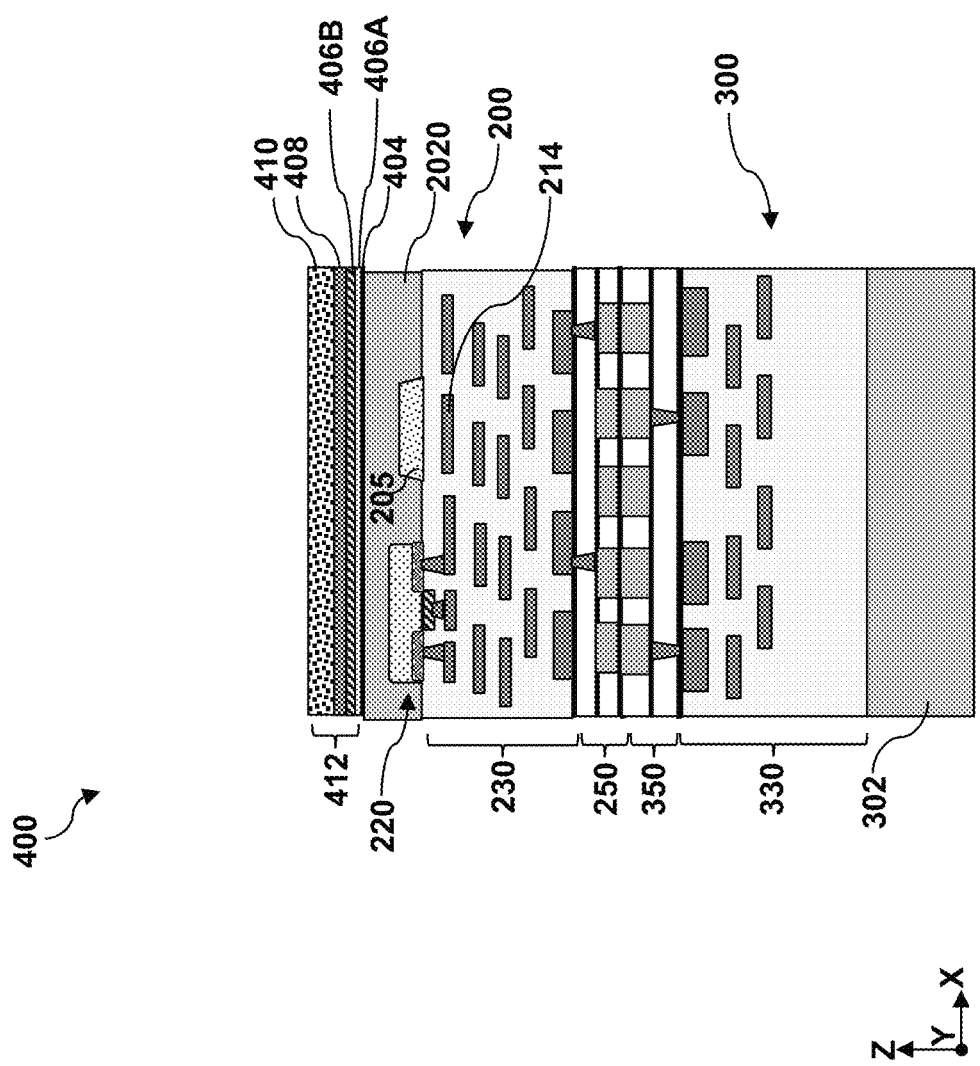
FIGS. 15-20 schematically illustrate various alternative embodiments according to various aspects of the present disclosure.
Figure 16:
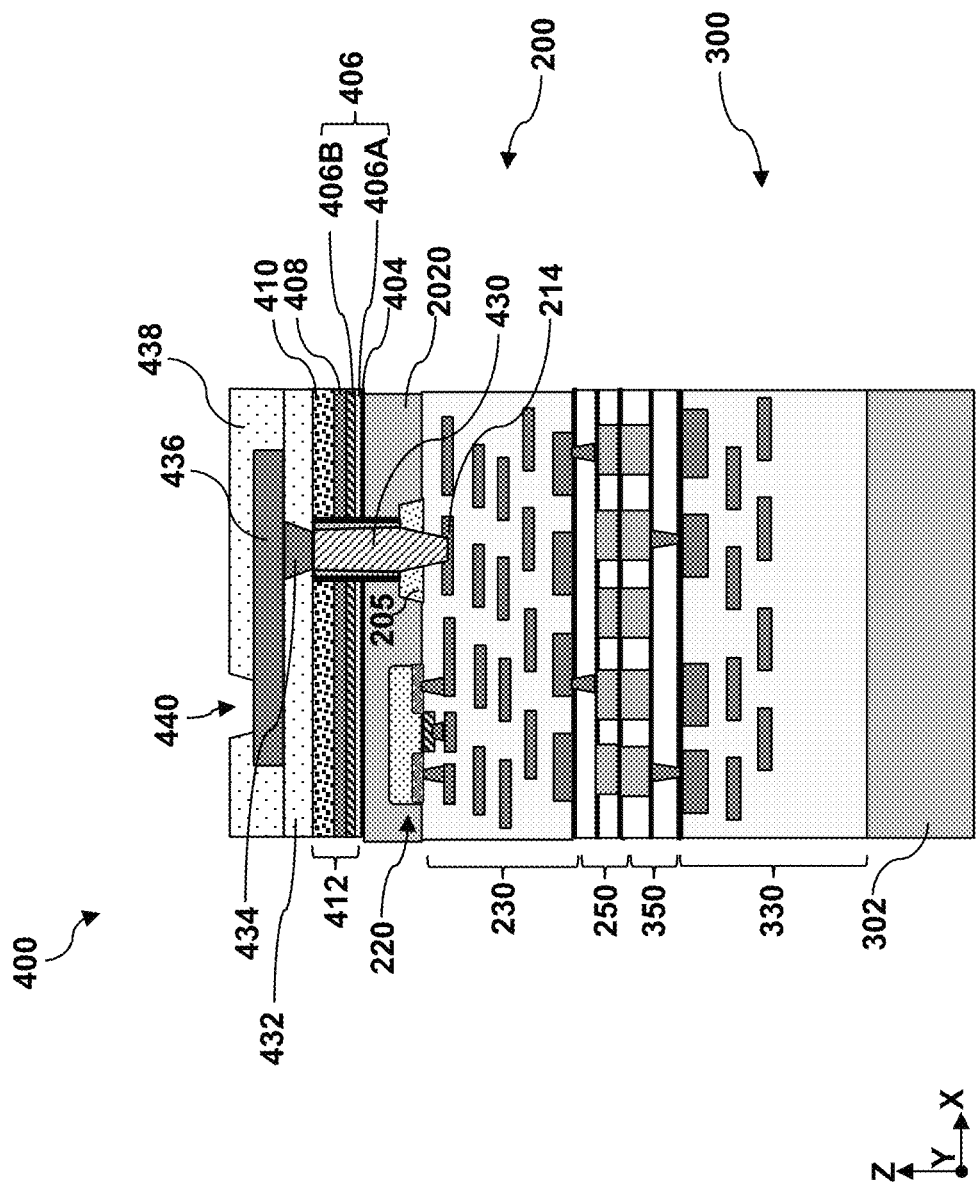

A first alternative embodiment is illustrated in FIGS. 15 and 16. In the first alternative embodiment, the first high-k dielectric layer 406 is a multi-layer and includes a first layer 406A and a second layer 406B over the first layer 406A. To implement the first alternative embodiment, block 110 of the method 100 includes depositing the first layer 406A and the second layer 406B on the interfacial layer 404. A composition of the first layer 406A is different from a composition of the second layer 406B. Both the first layer 406A and the second layer 406B are dipole-inducing layers that are configured to introduce a built-in negative fixed charge. The first layer 406A and the second layer 406B may be selected from aluminum oxide, titanium oxide, and zirconium oxide. Referring to FIG. 16, when the first high-k dielectric layer 406 includes the first layer 406A and the second layer 406B, the outer layer 420 is in direct contact with sidewalls of the first layer 406A and the second layer 406B. In one embodiment, the first layer 406A includes aluminum oxide and the second layer 406B includes titanium oxide. This first alternative embodiment may provide benefit if deposition rate of the second layer 406B is faster than that of the first layer 406A.

Figure 17:
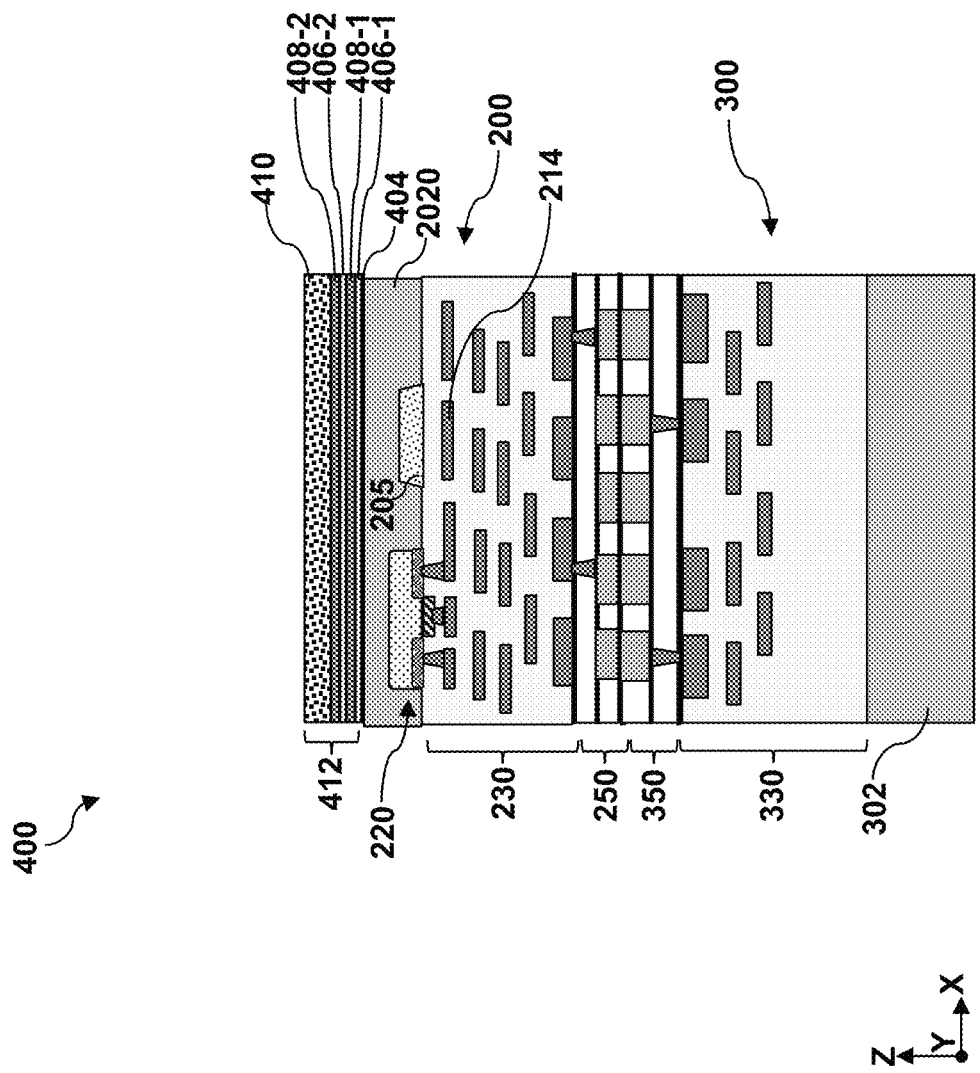
Figure 18:
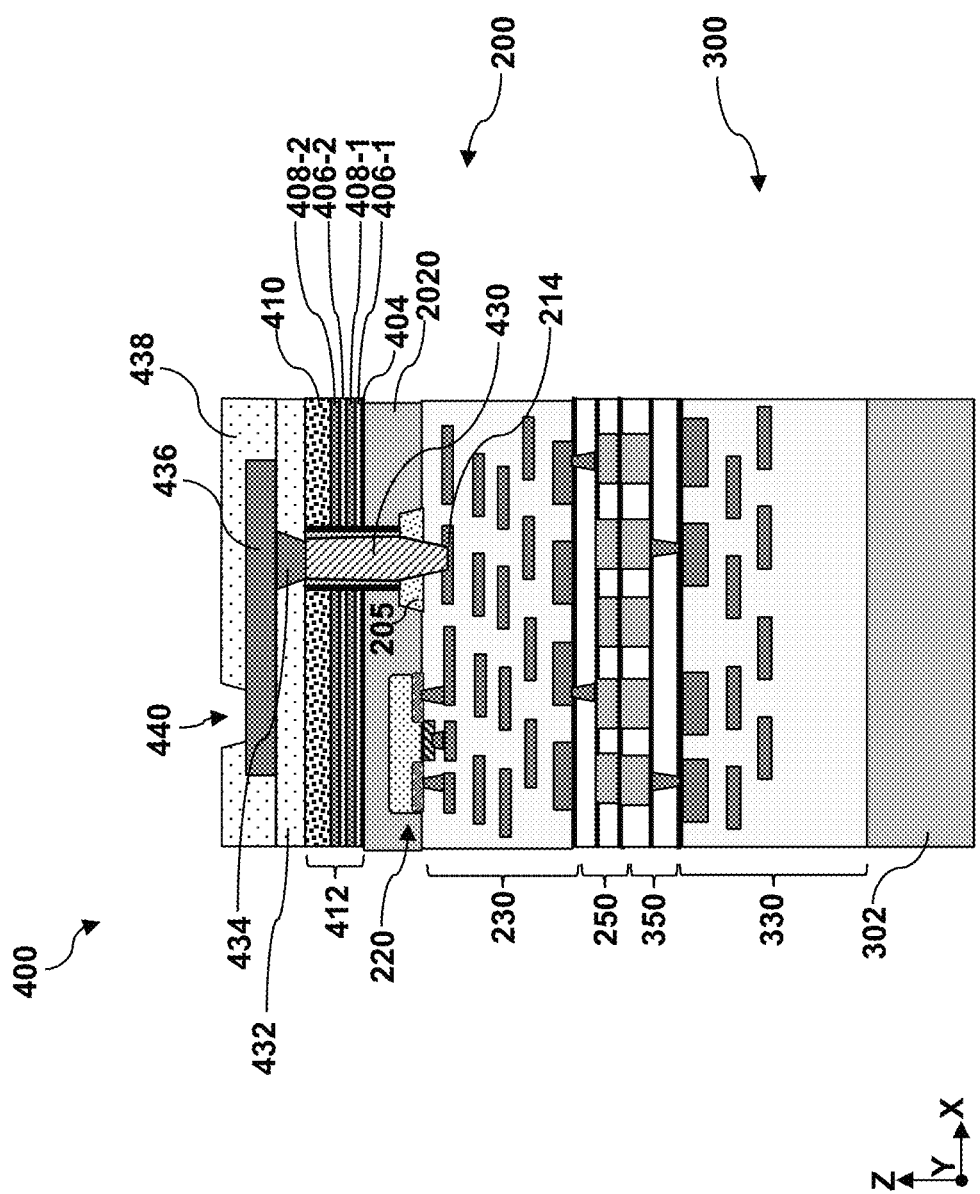

A second alternative embodiment is illustrated in FIGS. 17 and 18. In the second alternative embodiment, the first high-k dielectric layer 406 and the second high-k dielectric layer 408 are replaced by an alternating stack of a first dipole-inducing layer 406-1, a first moisture blocking layer 408-1, a second dipole-inducing layer 406-2, and a second moisture blocking layer 408-2. To implement the second alternative embodiment, block 110 of the method 100 includes sequentially depositing the first dipole-inducing layer 406-1, the first moisture blocking layer 408-1, the second dipole-inducing layer 406-2, and the second moisture blocking layer 408-2 one over another. The first dipole-inducing layer 406-1 and the second dipole-inducing layer 406-2 may include aluminum oxide, titanium oxide, or zirconium oxide. The first moisture blocking layer 408-1 and the second moisture blocking layer 408-2 may include tantalum oxide. Referring to FIG. 18, the outer layer 420 is in direct contact with sidewalls of the first dipole-inducing layer 406-1, the first moisture blocking layer 408-1, the second dipole-inducing layer 406-2, and the second moisture blocking layer 408-2.

Figure 19:
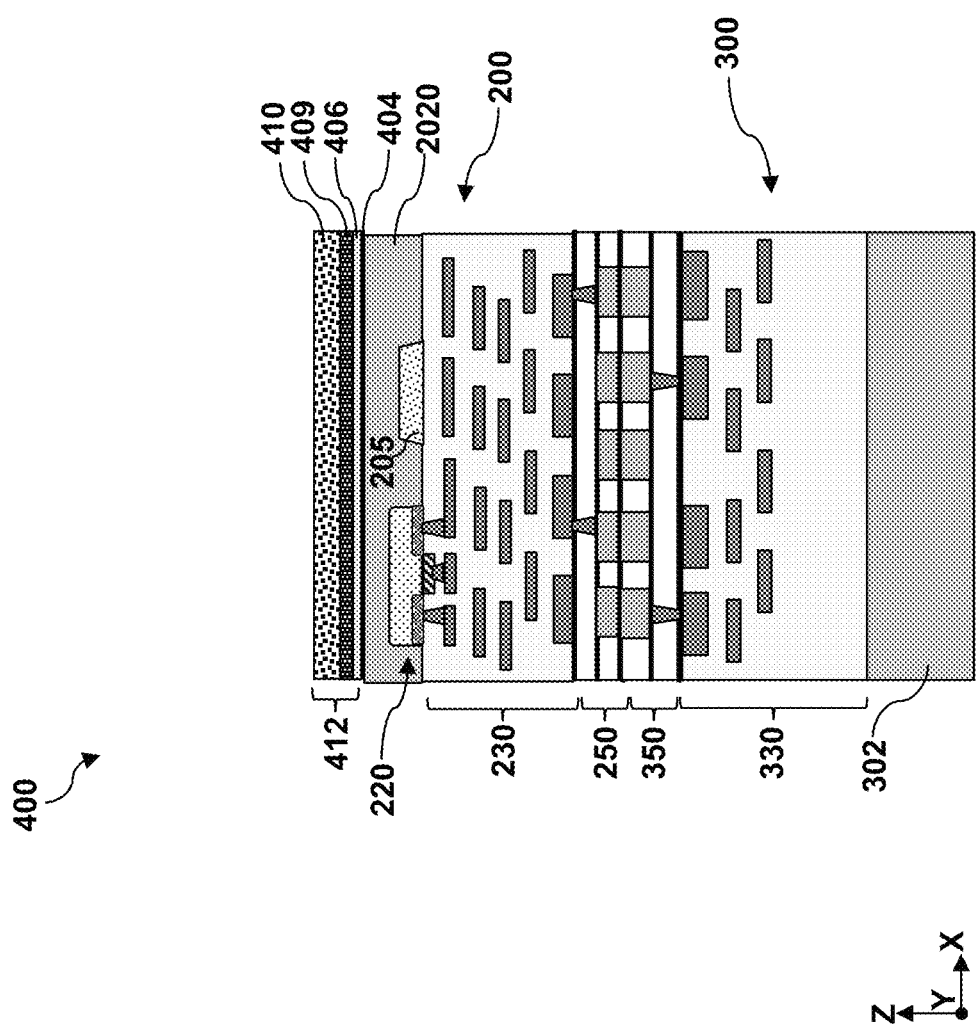
Figure 20:
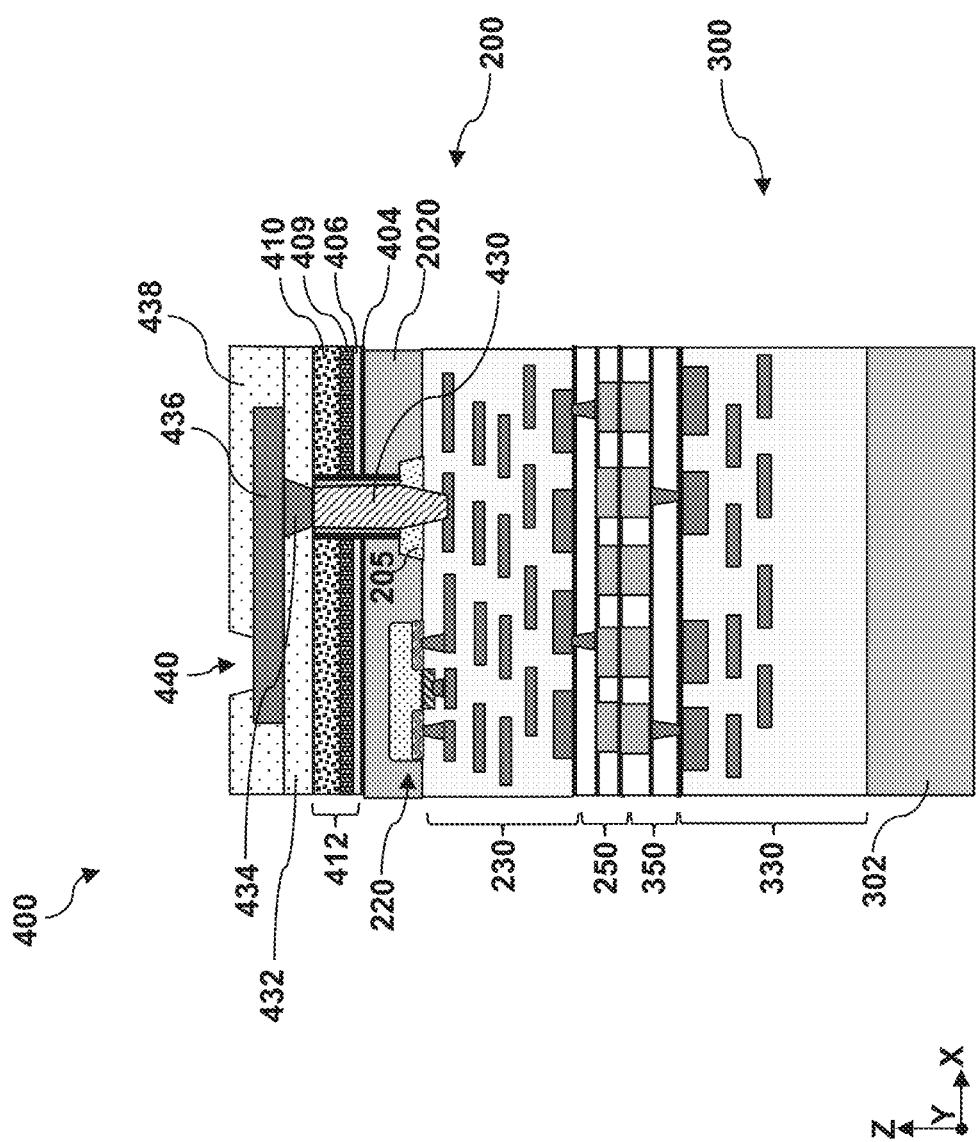

A third alternative embodiment is illustrated in FIGS. 19 and 20. In the third alternative embodiment, the second high-k dielectric layer 408 is replaced by a nitride layer 409. To implement the third alternative embodiment, block 110 of the method 100 includes depositing the nitride layer 409 directly on the first high-k dielectric layer 406. In some embodiments, the nitride layer 409 may include silicon nitride (SiN), aluminum nitride (AlN), oxygen-doped aluminum nitride (AlON), or boron nitride (BN). In one embodiment, the nitride layer 409 includes aluminum nitride (AlN). Referring to FIG. 20, the outer layer 420 is in direct contact with a sidewall of the nitride layer 409. In some instances, a thickness of the nitride layer 409 may be between about 200 Å and about 800 Å.

In one exemplary aspect, the present disclosure is directed to a package structure. The package structure includes a bottom substrate, a bottom interconnect structure over the bottom substrate, a top interconnect structure disposed over the bottom interconnect structure and including a metal feature, a top substrate over the top interconnect structure, and a protective film disposed on the top substrate. The protective film includes an interfacial layer on the top substrate, at least one dipole-inducing layer on the interfacial layer, a moisture block layer on the at least one dipole-inducing layer, and a silicon oxide layer over the moisture block layer. The at least one dipole-inducing layer includes aluminum oxide, titanium oxide or zirconium oxide.

In some embodiments, the at least one dipole-inducing layer includes a first layer and a second layer disposed over the first layer and a composition of the first layer is different from a composition of the second layer. In some implementations, a total thickness of the first layer and the second layer is between about 15 Å and about 55 Å. In some instances, the moisture block layer includes tantalum oxide, silicon nitride, aluminum nitride, oxygen-doped aluminum nitride, or boron nitride. In some embodiments, the interfacial layer includes silicon oxide. In some embodiments, the package structure further includes a backside through-substrate via (BTSV) extending through the protective film, the top substrate, and a portion of the top interconnect structure to contact the metal feature. In some instances, the BTSV is spaced apart from the interfacial layer, the at least one dipole-inducing layer, the moisture block layer, and the silicon oxide layer by a first liner and a second liner. A sidewall of the BTSV is in direct contact with the second liner and is spaced apart from the first liner by the second liner. In some instances, the first liner includes silicon oxide and the second liner includes silicon nitride. In some embodiments, the top substrate includes an isolation feature and the BTSV extends through the isolation feature. In some implementations, the BTSV is in direct contact with the isolation feature.

In another exemplary aspect, the present disclosure is directed to a device structure. The device structure includes a top interconnect structure, a top substrate disposed on the top interconnect structure, and a protective film disposed on the top substrate. The protective film includes at least one dipole-inducing layer, and a moisture block layer on the at least one dipole-inducing layer. The at least one dipole-inducing layer includes a flat band voltage shift greater than 0.4V and the moisture block layer includes tantalum oxide.

In some embodiments, the device structure further includes a bottom interconnect structure disposed below and bonded to the top interconnect structure, and a bottom substrate disposed below the bottom interconnect structure. In some embodiments, the device structure further includes a top bonding layer disposed on a bottom surface of the top interconnect structure, and a bottom bonding layer dispose on a top surface of the bottom interconnect structure. The top bonding layer is bonded to the bottom bonding layer such that the bottom interconnect structure is bonded to the top interconnect structure. In some implementations, the top bonding layer includes a first plurality of bonding features and the bottom bonding layer includes a second plurality of bonding features. Each of the first plurality of bonding features is vertically aligned with one of the second plurality of bonding features. In some embodiments, the at least one dipole-inducing layer includes aluminum oxide, titanium oxide, or zirconium oxide. In some instances, the protective film further includes an interfacial layer disposed between the top substrate and the at least one dipole-inducing layer, and a top oxide layer disposed over the moisture blocking layer.

In yet another exemplary aspect, the present disclosure is directed to a device structure. The device structure includes a top interconnect structure including a contact feature, a top substrate disposed on the top interconnect structure and including an isolation feature, and a protective film disposed on the top substrate. The protective film includes an interfacial layer, at least one dipole-inducing layer disposed over the interfacial layer, a moisture block layer on the at least one dipole-inducing layer, and a top oxide layer. The device structure further includes a through via extending through the protective film, the top substrate, the isolation feature, a portion of the top interconnect structure to contact the contact feature, and a via liner disposed between the through via and the protective film. The through via is in direct contact with the isolation feature and the contact feature.

In some embodiments, the at least one dipole-inducing layer includes aluminum oxide, titanium oxide or zirconium oxide. In some implementations, the moisture block layer includes tantalum oxide, silicon nitride, aluminum nitride, oxygen-doped aluminum nitride, or boron nitride. In some instances, the via liner includes a first liner in direct contact with the protective film, and a second liner in direct contact with the through via. The first liner includes silicon oxide and the second liner includes silicon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a bottom substrate;
    a bottom interconnect structure over the bottom substrate;
    a top interconnect structure disposed over the bottom interconnect structure and comprising a metal feature;
    a top substrate over the top interconnect structure and comprising an isolation feature extending into the top substrate;
    a protective film disposed on the top substrate, wherein the protective film comprises:
        an interfacial layer on the top substrate,
        at least one dipole-inducing layer on the interfacial layer and spaced apart from the top substrate by the interfacial layer,
        a moisture block layer on the at least one dipole-inducing layer, and
        a silicon oxide layer over the moisture block layer; and
    a backside through-substrate via (BTSV) extending through the protective film, the top substrate, the isolation feature, and a portion of the top interconnect structure to contact the metal feature,
    wherein the at least one dipole-inducing layer comprises aluminum oxide, titanium oxide or zirconium oxide,
    wherein the BTSV comprises a lower portion below the top substrate and an upper portion over the lower portion,
    wherein the upper portion is spaced apart from the protective film and the top substrate by a liner,
    wherein the liner does not extend between the lower portion and the isolation feature.

2. The package structure of claim 1,
    wherein the liner interfaces the interfacial layer, the at least one dipole-inducing layer, the moisture block layer, and the silicon oxide layer,
    wherein the at least one dipole-inducing layer comprises a first layer and a second layer disposed over the first layer,
    wherein a composition of the first layer is different from a composition of the second layer.

3. The package structure of claim 2, wherein a total thickness of the first layer and the second layer is between about 15 Å and about 55 Å.

4. The package structure of claim 1,
wherein the moisture block layer comprises tantalum oxide, silicon nitride, aluminum nitride, oxygen-doped aluminum nitride, or boron nitride,
wherein the moisture block layer comprises a thickness between about 600 Å and about 800 Å.

5. The package structure of claim 1, wherein the interfacial layer comprises silicon oxide.

6. The package structure of claim 1, wherein the BTSV comprises copper (Cu), nickel (Ni), cobalt (Co), aluminum (Al), or an alloy thereof.

7. The package structure of claim 1,
wherein the BTSV is spaced apart from the interfacial layer, the at least one dipole-inducing layer, the moisture block layer, and the silicon oxide layer by a first liner and a second liner,
wherein a sidewall of the BTSV is in direct contact with the second liner and is spaced apart from the first liner by the second liner.

8. The package structure of claim 7,
wherein the first liner comprises silicon oxide,
wherein the second liner comprises silicon nitride,
wherein top surfaces of the first liner and the second liner are coplanar with the top surface of the BTSV.

9. The package structure of claim 7, wherein the lower portion and the upper portion taper differently.

10. The package structure of claim 9, wherein the BTSV is in direct contact with the isolation feature.

11. A device structure, comprising:
a top interconnect structure;
a top substrate disposed on the top interconnect structure and comprising an isolation feature extending into the top substrate; and
a protective film disposed on the top substrate, wherein the protective film comprises:
at least one dipole-inducing layer, and
a moisture block layer on the at least one dipole-inducing layer; and
a through via extending through the protective film, the top substrate, the isolation feature, and a portion of the top interconnect structure,
wherein the at least one dipole-inducing layer comprises a flat band voltage shift greater than 0.4V,
wherein the moisture block layer comprises tantalum oxide,
wherein a thickness of the moisture block layer is between about 600 Å and about 800 Å,
wherein the through via comprises a lower portion below the top substrate and an upper portion over the lower portion,
wherein the lower portion and the upper portion taper differently.

12. The device structure of claim 11, further comprising:
a bottom interconnect structure disposed below and bonded to the top interconnect structure; and
a bottom substrate disposed below the bottom interconnect structure.

13. The device structure of claim 12, further comprising:
a top bonding layer disposed on a bottom surface of the top interconnect structure; and
a bottom bonding layer disposed on a top surface of the bottom interconnect structure,
wherein the top bonding layer is bonded to the bottom bonding layer such that the bottom interconnect structure is bonded to the top interconnect structure.

14. The device structure of claim 13,
wherein the top bonding layer comprises a first plurality of bonding features,
wherein the bottom bonding layer comprises a second plurality of bonding features,
wherein each of the first plurality of bonding features is vertically aligned with one of the second plurality of bonding features.

15. The device structure of claim 11, wherein the at least one dipole-inducing layer comprises aluminum oxide, titanium oxide, or zirconium oxide.

16. The device structure of claim 11, wherein the protective film further comprises:
an interfacial layer disposed between the top substrate and the at least one dipole-inducing layer; and
a top oxide layer disposed over the moisture blocking layer,
wherein the at least one dipole-inducting layer is spaced apart from the top substrate by the interfacial layer.

17. A device structure, comprising:
a top interconnect structure comprising a contact feature and an intermetal dielectric layer over the contact feature;
a top substrate disposed on the top interconnect structure and comprising an isolation feature, the isolation feature extending into the top substrate;
a protective film disposed on the top substrate, wherein the protective film comprises:
an interfacial layer,
at least one dipole-inducing layer disposed over the interfacial layer,
a moisture block layer on the at least one dipole-inducing layer, and
a top oxide layer;
a through via extending through the protective film, the top substrate, the isolation feature, a portion of the top interconnect structure to contact the contact feature; and
a via liner disposed between the through via and the protective film,
wherein the through via is in direct contact with the isolation feature, the intermetal dielectric layer and the contact feature,
wherein the through via comprises copper (Cu), nickel (Ni), cobalt (Co), aluminum (Al), or an alloy thereof,
wherein the via liner interfaces the interfacial layer, the at least one dipole-inducing layer, the moisture block layer, and the top oxide layer,
wherein top surfaces of the through via and the top oxide layer are coplanar.

18. The device structure of claim 17, wherein the at least one dipole-inducing layer comprises aluminum oxide, titanium oxide or zirconium oxide.

19. The device structure of claim 17, wherein the moisture block layer comprises tantalum oxide, silicon nitride, aluminum nitride, oxygen-doped aluminum nitride, or boron nitride.

20. The device structure of claim 17, wherein the via liner comprises:
a first liner in direct contact with sidewalls of the interfacial layer, the at least one dipole-inducing layer, the moisture blocking layer, and the top oxide layer; and
a second liner in direct contact with the through via, wherein the first liner comprises silicon oxide and the second liner comprises silicon nitride.

* * * * *